United States Patent [19]
Kim et al.

[11] Patent Number: 5,978,947
[45] Date of Patent: Nov. 2, 1999

[54] BUILT-IN SELF-TEST IN A PLURALITY OF STAGES CONTROLLED BY A TOKEN PASSING NETWORK AND METHOD

[75] Inventors: Ilyoung Kim, Plainsboro; Paul William Rutkowski, Bridgewater, both of N.J.; Yervant Zorian, Santa Clara County, Calif.

[73] Assignee: Lucent Technologies Inc., Murray Hill, N.J.

[21] Appl. No.: 08/944,617

[22] Filed: Oct. 7, 1997

[51] Int. Cl.[6] .................................................... G01R 31/28
[52] U.S. Cl. ............................................................ 714/733
[58] Field of Search .................................... 714/724, 733, 714/732, 726, 727, 728, 729, 730, 731, 735

[56] References Cited

U.S. PATENT DOCUMENTS

| | | | |
|---|---|---|---|
| 5,381,419 | 1/1995 | Zorian | 371/21.3 |
| 5,570,374 | 10/1996 | Yau et al. | 371/22.5 |
| 5,602,878 | 2/1997 | Cross | 375/354 |

OTHER PUBLICATIONS

*Pest & CKT: CAD Tools for Implementing BIST, ATE and Instrumentation Conference (1990)* by Meera M. Pradham and Paul R. Rutkowski.

"Simple And Efficient Algorithms For Functional RAM Testing" by Marian Marinescu, Computer Architecture Group, Paper 10.2, pp. 236–239.

Yervant Zorian, An Effective BIST Scheme for ROM's, *IEEE Transactions on Computers*, vol. 41, No. 5, May 1992.

*Primary Examiner*—Albert De Cady
*Assistant Examiner*—Jason Greene
*Attorney, Agent, or Firm*—Darby & Darby

[57] ABSTRACT

This invention relates to a token passing network, called a Universal BIST Scheduler (UBS), and a method for scheduling BISTed memory elements based on: executing BIST in multiple stages in order to optimize the efficiency of continuous processing and to apply a single waiting period to multiple SBRIC_RSs where, for example, BIST includes retention testing; dividing resource controllers or SBRIC_RSs corresponding to one or more RSB elements into a matrix such that each SBRIC_RS executes the BIST of its memory elements concurrently and/or successively depending on the SBRIC_RS's position in the matrix; and passing a token to initiate processing of a set of SBRIC_RSs in the matrix through a level signal rather than a pulse signal in order to ensure that the signal is not lost.

28 Claims, 7 Drawing Sheets

DIGITAL TOKEN PASSING CIRCUIT

BUILT-IN SELF-TEST IN A PLURALITY OF STAGES CONTROLLED BY A TOKEN PASSING NETWORK AND METHOD

FIELD OF THE INVENTION

The present invention relates to a token passing network and a method for scheduling built-in self-tests of one or more self-testing memory, Random Logic and Embedded core elements within a digital circuit in a plurality of stages.

BACKGROUND OF THE INVENTION

This invention relates to a token passing network and a method for scheduling Built-In Self-Test (BIST) in a plurality of stages in memory elements based on: a matrix and ring structure of resource controllers, e.g., Scheduled BIST Resource Interface controllers (SBRICs), controlling the memory elements; executing BIST in stages to optimize efficiency of such testing; and passing a token to initiate processing between sets of SBRICs in the matrix via a level signal rather than a pulse signal to ensure that the token is received.

The scale of integration of memory elements, for example Regular Structure semiconductor elements (such as RAMs, ROMs, CAMs, FIFOs or Embedded Cores) and Random Logic elements, has increased in modern digital circuits in order to increase the circuit's functionality. The increased density has also heightened the difficulty of testing such circuits with conventional external testing machines. Consequently, much effort has been devoted to "Design for Testability" approaches, including designing memory elements with BIST capability, that is, the capability to test themselves.

However, BIST capability within memory elements of Very Large Scale Integrated (VLSI) circuits has not eliminated the difficulty of testing. The testing of a VLSI circuit including a variety of BISTed elements (i.e., elements having BIST capability) requires that an interface be provided within the circuit to couple control signals between a test controller and the BISTed memory elements to initiate and schedule BIST efficiently.

One approach is described in U.S. Pat. No. 5,570,374 to Yau et al., which is assigned to Lucent Technologies, Inc. This patent is incorporated in its entirety herein by reference. This patent provides a BIST network, including at least two BISTed elements (for example, each comprising a RAM, ROM, FIFO or a Random Logic element). The control network comprises at least one SBRIC which controls one or more Regular Structure BISTed memory elements (such SBRIC is hereinafter referred to as the SBRIC_RS, and the memory elements with Regular Structure BIST are hereinafter referred to as RSB elements). In addition, the network comprises a plurality of SBRIC_RSs serially coupled in a daisy chain. The first SBRIC_RS in the chain serves to initiate self-testing of a first group of RSB elements which are coupled to the SBRIC_RS in parallel. Each successive SBRIC RS in the chain is responsive to a control signal generated by a previous SBRIC_RS in the chain and serves to initiate self-testing of the RSB elements in the corresponding successive group associated with that SBRIC_RS so that groups of RSB elements are tested in sequence. In addition, since each of the SBRIC_RSs runs on the same clock, they run on different clocks than the RSB elements they control.

There are several disadvantages of the approach described in the above patent. The serial coupling of the SBRIC_RSs limits processing to a single SBRIC_RS at a time. We have found that due to limitations on the number and type of RSB elements a single SBRIC_RS can control, this feature reduces the network's efficiency in testing a large number of different RSB elements at one time.

Another disadvantage is that the network is limited to one pass for each SBRIC_RS. That is, at the end of processing for the last SBRIC_RS in the serial daisy chain, no further processing by any SBRIC_RS can occur. Accordingly, where BIST testing includes a waiting period (for example, for retention testing), there is no means for initiating the processing of another one of the SBRIC_RS elements during the waiting period. In addition, where the BIST of more than one SBRIC_RS includes a waiting period, each SBRIC_RS must implement a waiting period separately rather than applying a single such waiting period to several SBRIC_RSs.

Since each of the SBRIC_RSs runs on the same clock, they do not run on the same clock as their RSB elements. This results in asynchronous processing between each SBRIC_RS and its RSB elements. As a result, we have found that the signals transmitted between a SBRIC_RS and its group of RSB elements may be lost.

An additional disadvantage is that the network's behavior cannot be modified once it is implemented. For example, one or more SBRIC_RSs cannot be disabled from processing their RSB elements in order to improve efficiency of the network. Such functionality can apply where a SBRIC_RS in position after others in the chain enters its fail state to indicate that at least one of its RSB elements failed BIST testing and the faulty RSB element is replaced. However, each of the SBRIC_RSs must rerun BIST rather than limiting BIST processing to solely the SBRIC_RS element having the replaced RSB element.

Therefore, there is a need to improve a BIST control network for scheduling the self-testing of a plurality of different types of BISTed memory elements.

SUMMARY OF THE INVENTION

This invention relates to a token passing network, called a Universal BIST Scheduler (UBS), and a method for scheduling BISTed memory elements based on: executing BIST in multiple stages in order to optimize the efficiency of continuous processing and to apply a single waiting period to multiple SBRIC_RSs where, for example, BIST includes retention testing; dividing resource controllers or SBRIC_RSs corresponding to one or more RSB elements into a matrix such that each SBRIC_RS executes the BIST of its memory elements concurrently and/or successively depending on the SBRIC_RS's position in the matrix; and passing a token to initiate processing of a set of SBRIC_RSs in the matrix through a level signal rather than a pulse signal in order to ensure that the signal is not lost.

More particularly, the UBS according to an illustrative embodiment of our invention can include a plurality of SBRIC_RSs organized into a matrix where each SBRIC_RS controls one or more (or a group of) RSB elements through a Regular Structure BIST controller (hereinafter referred to as a RSBCtl).

One aspect of our invention is that BIST testing for each RSB element can be executed in multiple stages or tests to complete BIST testing. For example, in the illustrative embodiment of our invention, there are three stages for BIST: during the first stage, a BIST algorithm is implemented according to the particular type of RSB element and the results of such testing are reflected in a "test signature" for each RSB element. After the first stage and before the second stage, retention testing is initiated. Retention testing identifies retention faults in the RSB elements or the loss of a data value stored in a memory cell over time. A retention fault occurs as a result of a leakage of one or more bits in a previously written cell or word after a period of time. In order to detect such faults, a waiting period sufficient to allow for leakage where such fault exists must occur. After the BIST algorithm has been implemented in the first stage and before the second stage, the waiting period is applied to each RSB element. During the second stage, the memory cells of each RSB element are reread to test whether after the waiting period, the binary values resulting from BIST testing during the first stage have been retained. The second stage comprises a retention test. In addition, during the second stage, the values in the memory cells are toggled such that the bit pattern in the memory cells is the complement of the bit pattern resulting from BIST testing. In between the second and third stages, another waiting period is implemented for retention testing of the complement bit pattern. Finally, during the third stage, the memory cells of each RSB element are reread to test whether, after the waiting period, the complement bit pattern from the second stage has been retained. Accordingly, the third stages also comprises a retention test.

In addition, in our invention, the multiple stage design for BIST and retention testing allows a single waiting period to be applied to the RSB elements. Where there are multiple RSB elements, this is accomplished by implementing each stage for every RSB element before initiating the next stage. For example, each RSB element completes BIST testing as a group or in sub-groups (as in the illustrative embodiment of our invention). Upon completion of BIST testing, each RSB element enters the waiting period. When the complete set of RSB elements has completed processing and entered the waiting period, a single waiting period is applied to the complete set. In this way, where particular RSB elements complete the first stage before other such elements, those which finish first will have a longer waiting period applied to them. However, implementing a single waiting period ensures that those RSB elements which complete the first stage last receive a sufficient waiting period. In addition, regardless of those RSB elements which finish the first stage early, applying a single waiting period to all RSB elements significantly reduces the overall waiting period in contrast to each RSB element implementing its own waiting period. Moreover, such reduction in overall waiting periods reduces the total test time of the UBS.

In addition, the multiple stage aspect of our invention can be implemented as to a single RSB element where such element executes its BIST testing during a first stage. Then, the RSB element begins retention testing during which waiting periods are applied between the first and second and second and third stages and the binary values of the memory cells are reread during the second and third stages. This aspect of our invention allows for separate processing to occur during the waiting periods in between stages of the BIST and retention testing for such element. Such separate processing need not be solely a waiting period. Rather, any processing can apply during such waiting period according to the design of a particular UBS.

In addition, in the illustrative embodiment of our invention, instead of a single RSB element, the RSB elements are separated into sets of elements, for example, a first and a second set. When each of the first set RSB elements has completed their first stages, then each of the RSB elements in the second set is initiated to begin its first stage. When each second set RSB element has completed its first stage, a waiting period is applied to both first and second set RSB elements. Then, the first and second sets repeat the same process for the second and third stages.

Accordingly, the multiple stage aspect of our invention can be applied to multiple RSB elements as well as a single RSB element. In addition, our invention contemplates additional stages of BIST currently known or hereinafter identified and multiple stages which do not necessarily include retention testing. Such stages in place of or in addition to retention testing can be based the particular design specifications of the UBS.

The SBRIC_RSs which initiate control of the RSB elements can be further organized as a matrix of elements. The matrix of SBRIC_RSs allows for control over processing the multiple stage aspect of our invention, where particular sets of RSB elements are controlled by a particular SBRIC_RS.

In addition, the staged processing aspect of our invention can also be applied to multiple sets of the SBRIC_RSs. Instead of a single series of SBRIC_RSs, there are two series organized into columns A and B. For example, a first series in column A and a second series in column B. The column A SBRIC_RSs are triggered to execute their BIST. Upon completion by each SBRIC_RS in column A of one stage of BIST testing of their RSB elements, the column B SBRIC_RSs are triggered to execute their BIST in parallel. The same processing is applied to each of the multiple stages in the illustrative embodiment.

Another aspect of our invention is that the SBRIC_RSs and their RSB elements can run synchronously using the same clock. This avoids any communication problems between the SBRIC_RSs and their RSB elements so that the chance of signal loss is greatly reduced. However, particular SBRIC_RSs (for example, in a given column) controlling RSB elements which have different clock domains result in each of the SBRIC_RSs running on different clocks. This impacts passing a TOKEN signal (i.e., control) to initiate processing of the next column of SBRIC_RSs based on each SBRIC_RS in the preceding column asserting a PASS signal to indicate that it has completed all or a portion of its BIST processing. Our invention allows for such different clock domains for each SBRIC_RS in a column because the PASS signal asserted by each SBRIC_RS is a level signal rather than a pulse signal. In this way, a token passing circuit, which analyzes the PASS signals received as inputs in order to determine when the SBRIC_RSs in a column have completed their BIST and to assert the TOKEN signal to initiate processing of the next column of SBRIC_RSs, receives continuous signals which cannot be lost. Accordingly, our invention provides improved synchronous communication between SBRIC_RSs and their RSB elements, while, at the same time, ensuring that the digital token passing circuit receives its input PASS signals as such signals level rather than pulse signals.

BRIEF DESCRIPTION OF THE DRAWINGS

The foregoing and other features and advantages of the present invention will be more readily apparent from the following detailed description and drawings of illustrative embodiments of the present invention in which.

DESCRIPTION OF THE ILLUSTRATIVE EMBODIMENTS

Figure 1:
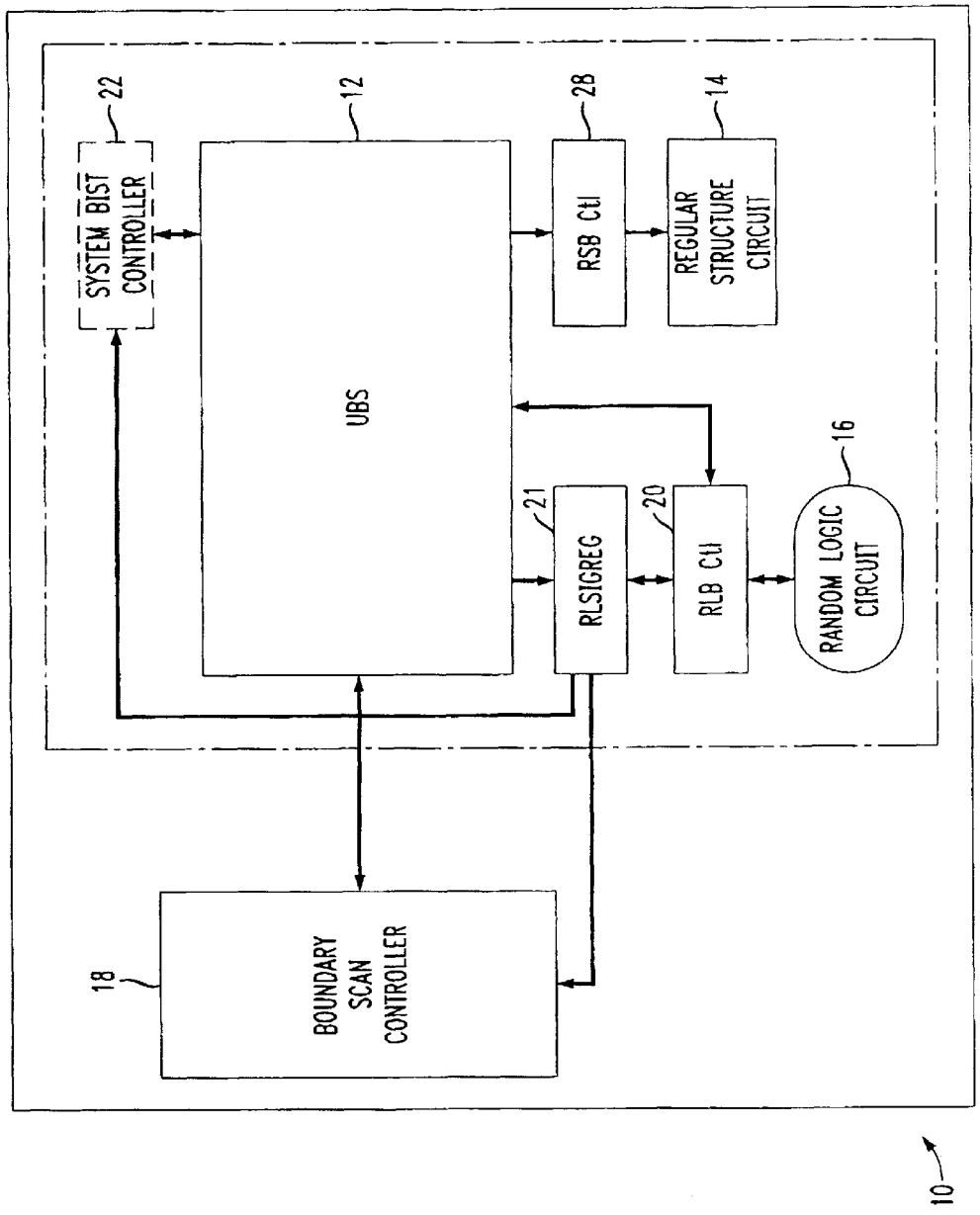
FIG. 1 is a block diagram of a chip level view of a BIST control architecture according to the present invention comprising a UBS circuit, a circuit of RSB elements (hereinafter a Regular Structure circuit), a Random Logic circuit and its control components, a System BIST controller and a Boundary Scan controller.

FIG. 1 is a block diagram of a chip level view of a BIST control architecture for chip 10 according to the present invention comprising a UBS 12, a Regular Structure circuit 14 and one of its control components (a RSBCt1 elements 28), a Random Logic circuit 16 and its control components (a RLBCt1 element 20 and a RLSIGREG element 21), a System BIST controller 22 and a Boundary Scan controller 18.

The UBS 12 can initiate and control BIST testing for the Regular Structure circuit 14 and the Random Logic circuit 16. The UBS 12 can also interface the results of the BIST testing operations for circuit 14 to processors residing outside of the UBS 12 via the System BIST controller 22 and/or the Boundary Scan controller 18. (The System BIST controller 22 resides outside the UBS 12; other such processors are not shown.) In addition to scheduling the BIST of the Regular Structure circuit 14 through the operations of the RSBCt1 elements 28, the UBS 12 can also schedule testing of the Random Logic circuit 16 through the operations of the RLBCt1 element 20. The results of BIST for the Random Logic circuit 16 can be stored in a RLSIGREG element 21 (i.e., a parallel to serial shift register) so they can be passed to devices (not shown) outside the UBS 12, via either the Boundary Scan controller 18 or the System BIST controller 22.

Figure 2:
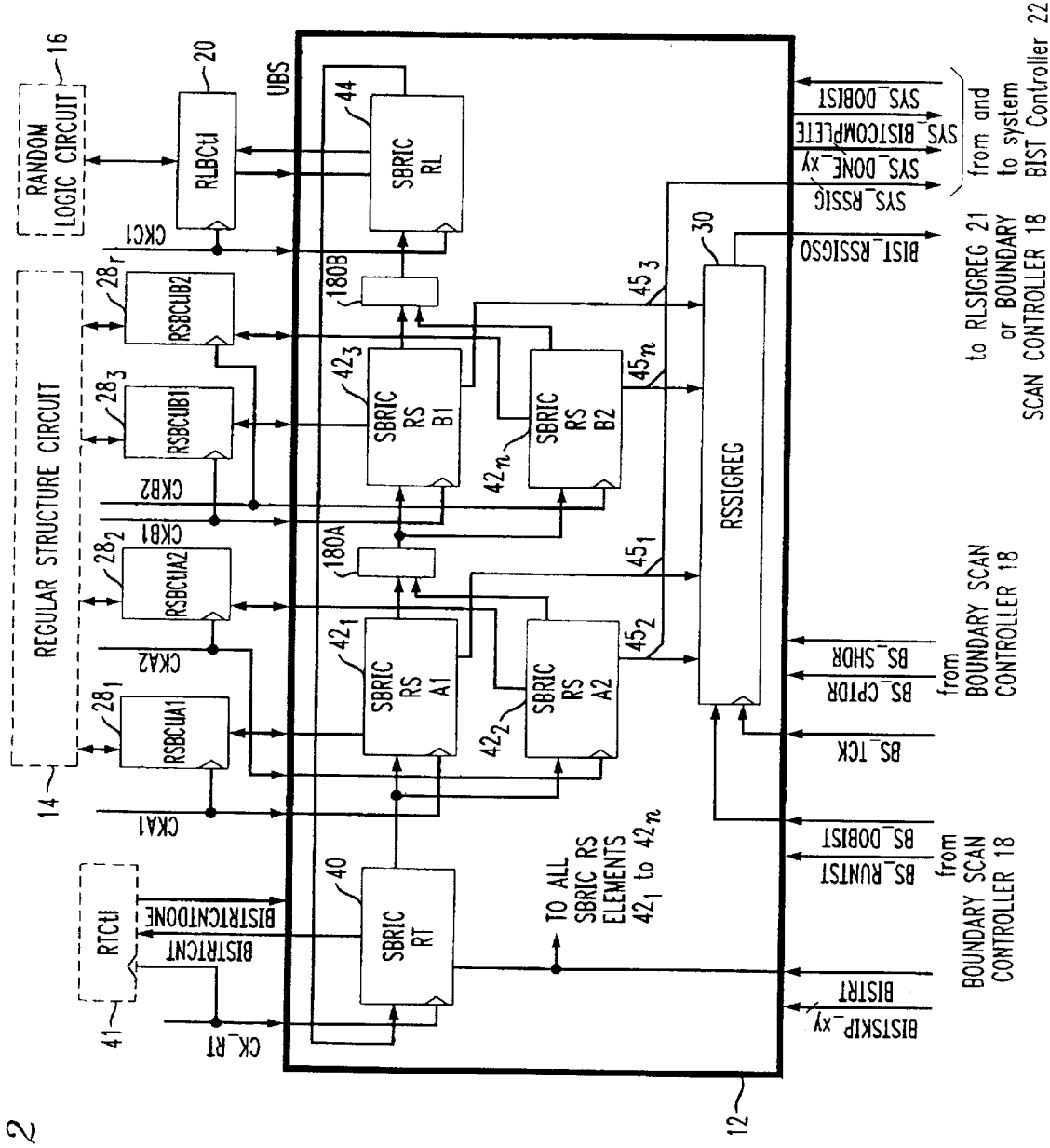
FIG. 2 is a block diagram of a series of RSBCt1 elements and the UBS of FIG. 1, including a matrix of SBRIC_RS elements, a SBRIC element for controlling the Random Logic block (hereinafter referred to as the SBRIC_RL element), a SBRIC element for retention testing (hereinafter called the SBRIC_RT element), a digital token passing circuit and a RSSIGREG element.

Referring to FIG. 2, there is shown a block diagram of the UBS 12 of FIG. 1 according to a preferred embodiment of our invention, including a SBRIC_RT element 40, a RTCt1 element 41, a matrix of SBRIC_RS elements $42_1, 42_2, \ldots 42_n$, (where n is an integer corresponding to the number of the SBRIC_RS elements in the UBS 12; for the embodiment of FIG. 2, n equals 4), a series of RSBCt1 elements $28_1, 28_2, \ldots 28_r$ (where r is an integer corresponding to the number of the RSBCt1 elements served by the UBS 12; for the embodiment of FIG. 2, r equals 4), two digital token passing circuits 180A and 180B, a SBRIC_RL element 44, the RLBCt1 element 20 and a RSSIGREG element 32 (i.e., a parallel to serial shift register).

Controllers, for example, the Scheduled BIST Resource Interface controller (SBRIC) elements 40, $42_1$ to $42_n$ and 44, the RLBCt1 element 20 or the RSBCt1 elements $28_1$ to $28_r$, schedule the operation of the Regular Structure circuit 14 and the Random Logic circuit 16 and synchronize the operation of such elements 14 and 16 with the operation of the UBS 12.

The UBS 12 can be controlled by either the System BIST controller 22 or the Boundary Scan controller 18. When the UBS 12 is controlled by the System BIST controller 22, the controller 22 sends a SYS_DOBIST signal having a binary one value in order to activate the UBS 12. When the circuit 18 controls the UBS 12, the circuit 18 sends BS DOBIST and BS_RUNTST signals in order to activate such UBS 12. The BS_DOBIST signal corresponds to the presence of the IEEE Standard 1149.1 RUNBIST opcode in the Boundary Scan instruction register and the BS_RUNTST signal corresponds to the Boundary Scan TAP state machine (not shown) being in the Run-Test/Idle state. In this embodiment of the invention, where either the controller 22 or the circuit 18 controls the UBS 12, the signal from the non-active controller can be held at a binary zero value to avoid interfering with the other controller.

The SBRIC_RT element 40 can be used to initiate the BIST testing operation in the UBS 12. The element 40 can be run by any clock, such as a CK_RT. It can also be controlled by an external element, such as the RTCt1 element 41. The RTCt1 element 41 can communicate with the SBRIC_RT element 40 via a BISTRTCNT signal and a BISTRTCNTDONE signal in order for the element 41 to oversee the operations of the element 40. Where the RTCt1 element 41 is used, the elements 40 and 41 can run synchronously within the same clock domain. This reduces the chance of signal loss during communications between them.

The SBRIC_RS elements $42_1$ and $42_2$ form a column A of the matrix of SBRIC_RSs and SBRIC_RS elements $42_3$ to $42_n$ form column B of the matrix. All of the elements $42_1$ to $42_n$ are used to execute BIST of the Regular Structure circuit 14, where each SBRIC_RS elements $42_1$ to $42_n$ control one or more of the RSBCt1 elements $28_1$ to $28_r$. For example, the SBRIC_RS element $42_1$ controls the RSBCt1 element $28_1$ and the SBRIC_RS element $42_3$ controls the RSBCt1 element $28_3$. In addition, any element $42_1$ to $42_n$ can control a series of elements $28_1$ to $28_r$. Further, each of the SBRIC_RS elements $42_1$ to $42_n$ and their corresponding one or more RSBCt1 elements $28_1$ to $28_r$ are run synchronously within the same clock domain, thereby reducing the chance of signal loss between them.

FIG. 2 also shows the digital token passing circuits 180A and 180B with which the UBS 12 controls passing the TOKEN signal between sets of SBRIC_RS elements organized into columns (i.e., column A comprising the SBRIC_RS elements $42_1$ and $42_2$ and column B comprising the SBRIC_RS elements $42_3$ and $42_n$, where n equals 4). Passing the TOKEN signal initiates or continues BIST testing in stages.

In addition, the SBRIC_RL element 44 can be the last SBRIC in the series of SBRIC elements 40 and $42_1$ to $42_n$. The SBRIC_RL element 44 controls the BIST testing operation for the Random Logic circuit 16. Except for the use of the SBRIC_RL element 44 which affects the scheduling of the Regular Structure circuit 14, BIST testing of the circuit 16 is well known, as shown in Meera M. Pradhan and Paul R. Rutkowski, *PEST & CKT: CAD Tools for Implementing BIST*, ATE and Instrumentation Conference (1990), incorporated in its entirety herein by reference. Therefore, BIST testing of the circuit 16 will not be described further herein.

The UBS 12 further comprises the RSSIGREG element 32, which is a parallel to serial shift register. The RSSI- GREG element 32 collects the results of BIST testing from the SBRIC_RS elements $42_1$ to $42_n$ over lines $45_1$, $45_2$, $45_3$ to $45_n$, and then outputs these results to the Boundary Scan controller 18. The System BIST controller 22 can also receive the results of BIST testing by reading the SBRIC_RS elements $42_1$ to $42_n$ via the communication lines $45_1$, $45_2$, $45_3$ to $45_n$ between the RSSIGREG element 32 and such elements $42_1$ to $42_n$, as illustrated in FIG. 2.

In addition, processing of the RSSIGREG element 32 can be controlled by the circuit 18. The circuit 18 can be used to initiate capture of results of BIST testing by the RSSIGREG element 32, with the use of the following signals: a BS_TCK signal to the RSSIGREG element 32, which can be the clock to the RSSIGREG element 32; BS_CPTDR signal to the RSSIGREG element 32, which can be used to capture the results from BIST testing; a BS_SHDR signal to the RSSIGREG element 32, which can be used to shift the results out of the RSSIGREG element 32; and, a BIST_RSSIGS0 signal from the RSSIGREG element 32, which is used to send the contents of the RSSIGREG element 32 daisy-chained with RLSIGREG element 21 directly to the circuit 18. Per IEEE Standard 1149.1, the BS_TCK signal corresponds to the Boundary Scan clock (not shown), the BS_CPTDR signal corresponds to the Boundary Scan TAP state machine (not shown) residing in the capture-DR state, and the BS_SHDR signal corresponds to the Boundary Scan TAP state machine residing in the Shift-DR state.

In addition, where the System BIST controller 22 is used to capture the results of BIST testing from the UBS 12, the following signals are transmitted between the controller 22 and the UBS 12: a plurality of SYS_DONE_xy signals where the signal line is shown with a cross line to indicate that it includes a plurality of signals, each of which is asserted when its respective SBRIC_RS element $42_1$ to $42_n$ is in its END state 102 (described with reference to FIG. 3) (the SYS_DONE_xy signals can be used for polling the progress of BIST testing); a SYS_BISTCOMPLETE signal from the UBS 12, which is a flag indicating that all of the SBRIC_RS elements $42_1$ to $42_n$ have completed their BIST testing (which can be used for polling the progress of the completion of all BIST testing); and, a plurality of the SYS_RSSIG signals, each corresponding to SBRIC_RS element $42_1$ to $42_n$, which are the BIST results from such elements (the SYS_RSSIG signal line in FIG. 2 has a cross line to indicate that it contains multiple signals).

Figure 2A:
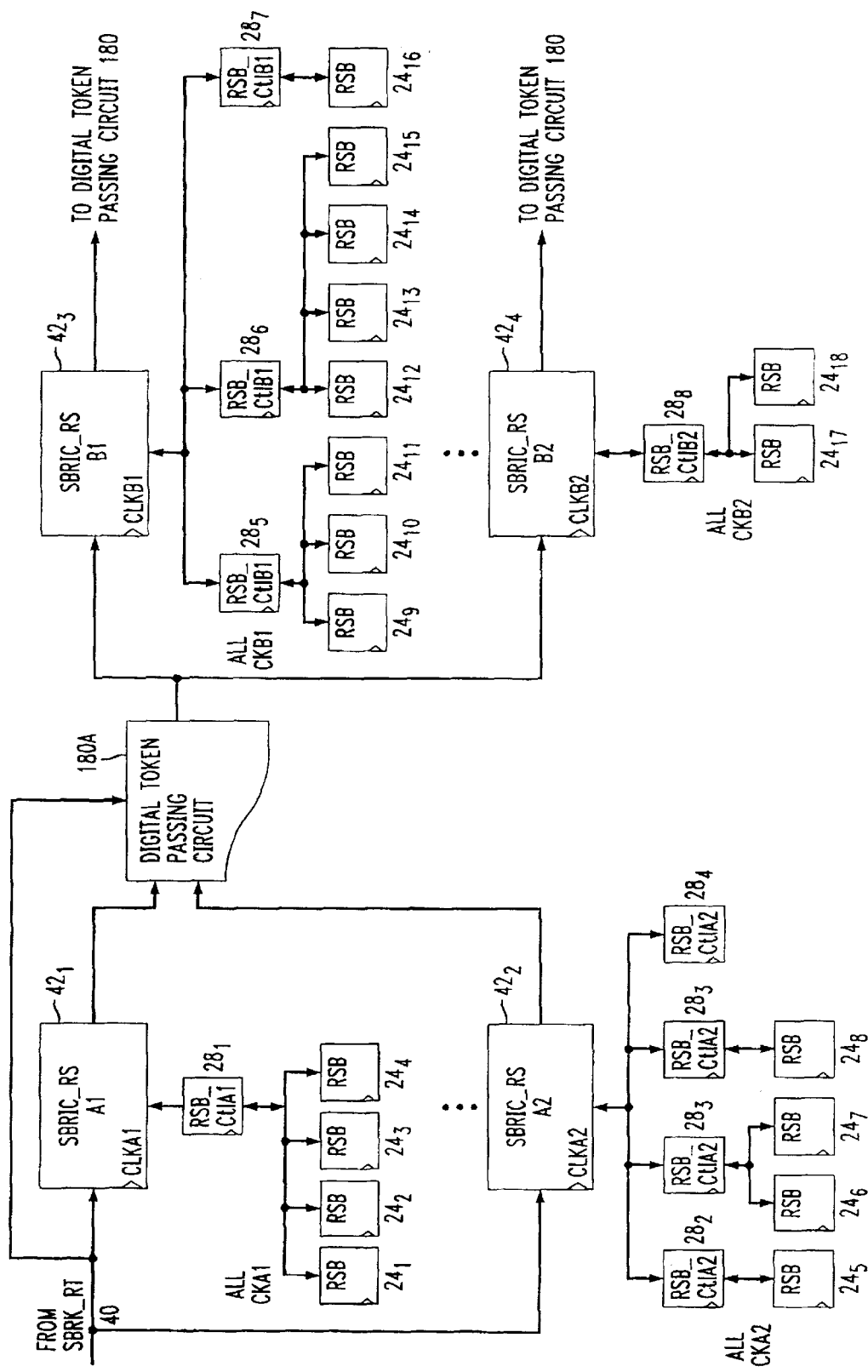
FIG. 2A is a block schematic diagram of a matrix of the SBRIC_RS elements comprising part of the UBS of FIG. 1, the digital token passing circuit and a series of RSBCt1 elements which the SBRIC_RS elements use to control the RSB elements.

As shown in FIG. 2A, the SBRIC_RS elements $42_1$ to $42_n$ control their corresponding RSBCt1 elements $28_1$ to $28_r$, which in turn control one or more RSB elements $24_1$, $24_2$ ... $24_m$ (where m is an integer corresponding to the number of RSB elements in the UBS 12). Such elements $24_1$ to $24_m$ comprise the Regular Structure circuit 14. In FIG. 2A there is shown the RSB elements $24_1$ to $24_{18}$ are shown, where m equals 18; the SBRIC_RS elements $42_1$ to $42_4$ (i.e., n equals 4), the RSBCt1 elements $28_1$ to $28_8$ (i.e., r equals 8), and a digital token passing circuit 180A.

The SBRIC_RS elements $42_1$ to $42_4$ and the RSBCt1 elements $28_1$ to $28_8$ comprise part of the USB 12 while the RSB elements $24_1$ to $24_{18}$ comprise the Regular Structure circuit 14. Each SBRIC_RS element $42_1$ to $42_4$ controls a series of the RSBCt1 elements $28_1$ to $28_8$ in order to control one or more RSB elements $24_1$ to $24_{18}$. Each of the RSB elements $24_1$ to $24_{18}$ can comprise a digital logic memory element, for example, a RAM, ROM, CAM or FIFO, which has BIST capability. The number and type of elements $24_1$ to $24_{18}$ present in each group controlled by a single SBRIC_RS element $42_1$ to $42_4$ depends on the function of the circuit 14 and can include a larger or smaller number of elements, arranged the same or differently from those shown in FIG. 2A. Additionally, a single group (i.e., controlled by a single SBRIC_RS element $42_1$ to $42_4$) can include more than one type of RSB element, including memory elements which do not have BIST capability (not shown).

One aspect of our invention is that BIST testing for each RSB element $24_1$ to $24_{18}$ can be executed in multiple stages. For example, in the illustrative embodiment, there are three stages for BIST: during the first stage, a BIST algorithm is implemented according to the particular type of element $24_1$ to $24_{18}$ and the results of such testing are reflected in a "test signature" for each such element. After the first stage and before the second stage, retention testing is initiated. Retention testing identifies retention faults in the RSB elements $24_1$ to $24_{18}$ or the loss of a data value stored in a memory cell over time. A retention fault occurs as a result of a leakage of one or more bits in a previously written cell or word after a period of time. In order to detect such faults, a waiting period sufficient to allow for leakage where such fault exists must occur. After the BIST algorithm has been implemented in the first stage and before the second stage, the waiting period is applied to each element $24_1$ to $24_{18}$. During the second stage, the memory cells of each such element are reread to test whether, after the waiting period, the binary values resulting from BIST testing during the first stage have been retained. In addition, during the second stage, the values in the memory cells are toggled such that the bit pattern in the memory cells is the complement of the bit pattern resulting from BIST testing. In between the second and third stages, another waiting period is implemented for retention testing of the complement bit pattern. Finally, during the third stage, the memory cells of each element $24_1$ to $24_{18}$ are reread to test whether after the waiting period, the complement bit pattern from the second stage has been retained.

In addition, in our invention, the multiple stage design for BIST and retention testing allows a single waiting period to be applied to the RSB elements $24_1$ to $24_{18}$. Where there are multiple such elements, as in FIG. 2A for example, this is accomplished by implementing each stage for every element $24_1$ to $24_{18}$ before initiating the next stage. For example, each element $24_1$ to $24_{18}$ completes BIST testing as a group or in sub-groups (as in the illustrative embodiment of our invention). Upon completion of BIST testing, each such element in a group or sub-group enters the waiting period. When the complete set of such elements has completed processing and entered the waiting period, a single waiting period is applied to the complete set. In this way, where particular elements $24_1$ to $24_{18}$ complete the first stage before other such elements, those which finish first will have a longer waiting period applied to them. However, implementing a single waiting period ensures that those elements $24_1$ to $24_{18}$ which complete the first stage last receive a sufficient waiting period. In addition, regardless of those elements $24_1$ to $24_{18}$ which finish the first stage early, applying a single waiting period to all such elements significantly reduces the overall waiting period in contrast to each such element implementing its own waiting period.

In addition, the multiple stage aspect of our invention can be implemented as to a single element $24_1$ (a single element is not shown), where such element executes its BIST testing during a first stage. Then, the element $24_1$ begins retention testing during which waiting periods are applied between the first and second, and second and third stages and the binary values of the memory cells are reread during the second and third stages. This aspect of our invention allows for separate processing to occur during the waiting periods in between stages of the BIST and retention testing for such element $24_1$. Such separate processing need not be solely a waiting period. Rather, any processing can be performed during such a waiting period according to the design of a particular UBS 12.

In the illustrative embodiment of our invention shown in FIG. 2A, instead of a single element $24_1$, the RSB elements $24_1$ to $24_{18}$ are separated into sets of elements, namely, elements $24_1$ to $24_5$ and elements $24_5$ to $24_8$ form the first set and elements $24_9$ to $24_{16}$ and elements $24_{17}$ to $24_{18}$ form the second set. When each of the elements $24_1$ to $24_8$ has completed their first stages, then each element $24_9$ to $24_{18}$ in the second set is initiated to begin its first stage. When each element $24_9$ to $24_{18}$ has completed its first stage, a waiting period is applied to all elements $24_1$ to $24_{18}$. Then, the first and second sets repeat the same process for the second and third stages.

Accordingly, the multiple stage aspect of our invention can be applied to the structure of RSB elements $24_1$ to $24_{18}$ shown in FIG. 2A as well as a single RSB element $24_1$ (not shown) depending on the function of the RSB elements 24 in a given UBS 12. In addition, our invention contemplates additional stages of BIST currently known or hereinafter identified and multiple stages which do not necessarily include retention testing. Such stages in place of or in addition to retention testing can be based the particular design specifications of the UBS 12. Accordingly, our invention is not limited to additional stages of retention testing or any number of stages.

As further shown in FIG. 2A, the SBRIC_RS elements $42_1$ to $42_4$ which initiate control of the RSB elements $24_1$ to $24_{18}$ can be further organized as a matrix of elements. The matrix of SBRIC_RS elements $42_1$ to $42_4$ allows for control over processing the multiple stage aspect of our invention, where RSB elements $24_1$ to $24_8$ are controlled by SBRIC_RS elements $42_1$ to $42_2$ and RSB elements $24_9$ to $24_{18}$ are controlled by SBRIC_RS elements $42_3$ to $42_4$.

In FIG. 2A, the SBRIC_RS elements $42_1$ and $42_2$ are triggered to execute their BIST (i.e., initiate the BIST testing of the RSB elements $24_1$ to $24_8$ they control) in parallel. Upon completion by each SBRIC_RS element $42_1$ and $42_2$ of one stage of BIST testing of their RSB elements $24_1$ to $24_8$, the SBRIC_RS elements $42_3$ and $42_4$ are triggered to execute their BIST. The same processing is applied to each of the multiple stages in the illustrative embodiment.

In addition, our invention can be applied to a single series of SBRIC_RS elements $42_1$ and $42_2$ (the single series is not shown) regardless of whether BIST testing is implemented in multiple stages. This aspect allows for multiple SBRIC_RS elements $42_1$ to $42_2$ to execute BIST of their respective RSB elements $24_1$ to $24_4$ and $24_5$ to $24_8$ (as shown in FIG. 2A for the SBRIC_RS element $42_1$ and $42_2$, respectively) at the same time. Since each SBRIC_RS element $42_1$ and $42_2$ is run on the same clock domain as the RSB elements $24_1$ to $24_4$ and $24_5$ to $24_8$ it controls, parallel processing increases the number of RSB elements $24_1$ to $24_8$ with different clock domains which can self-test concurrently.

In the illustrative embodiment of our invention shown in FIG. 2A, instead of a single series of SBRIC_RS elements $42_1$ to $42_4$, there are two series shown in two columns A and B, the elements $42_1$ and $42_2$ as one series in column A and the elements $42_3$ and $42_4$ as a second series in column B. However, our invention is not limited to the structure of the SBRIC_RS elements $42_1$ to $42_4$ illustrated in FIG. 2A. Rather, there can be any number of SBRIC_RS elements 42 in a given column and any number of columns.

In order to further describe the processing of the UBS 12, the matrix configuration of SBRIC_RS elements $42_1$ to $42_4$ shown in FIG. 2A can have additional designations as follows: each SBRIC_RS element $42_1$ to $42_4$ in the matrix can be assigned a xy tag that identifies its position in the matrix. The x component can be an alphabetic character corresponding to the column of the element's matrix position, starting with an A for the left-most column (or the column closest to the SBRIC RT element 40). The y component can be a numerical character corresponding to the row of the element's matrix position, starting with 1 for the top row. For example, the SBRIC RS element $42_1$ is the first SBRIC_RS element in row 1 of column A; hence, it can be referred to as the SBRIC_RS_A1. In addition, the BISTSKIP_xy and SYS_DONE_xy signals (shown in FIG. 2) also correspond to individual SBRIC_RS elements $42_1$ to $42_n$ by the x and y components. For example, SBRIC_RS_A1 corresponds to the BISTSKIP_A1 and SYS_DONE_A1 signals.

There may also be a larger or smaller number of the SBRIC_RS elements 42, to $42_n$, which can comprise a larger or smaller number of columns of such elements $42_1$ to $42_n$. The number of such SBRIC_RS elements $42_1$ to $42_n$ need not be arranged in a matrix such that there are identical numbers of such elements in each row and column. Rather, the number and organization of the elements $42_1$ to $42_n$, as well as the number of RSBCt1 elements $24_1$ to $24_r$ and the RSB elements $28_1$ to $28_n$ controlled by elements $42_1$ to $42_n$, can be customized to suit the design specifications of the UBS 12. Accordingly, any configuration and number of such elements $42_1$ to $42_n$ are contemplated as within the scope of our invention.

The UBS 12 (FIG. 2) schedules the execution of BIST testing for groups of RSB elements $24_1$ to $24_{18}$ according to the position in the matrix of the SBRIC_RS element $42_1$ to $42_4$ which controls such group. The SBRIC_RS elements $42_1$ to $42_4$ in each column initiate or continue the BIST of their elements $24_1$ to $24_{18}$ concurrently. For example, each SBRIC_RS element $42_1$ and $42_2$ in column A initiates BIST of their RSB elements $24_1$ to $24_5$ and $24_6$ to $24_8$ concurrently. When the column A SBRIC_RS elements $42_1$ and $42_2$ have completed a portion of all of their BIST testing, then control is passed to the next column B of such elements $42_3$ and $42_4$. Such elements $42_3$ and $42_4$ then initiate their BIST concurrently.

In addition, the UBS 12 (FIG. 2) passes control between columns of SBRIC_RS elements $42_1$ and $42_2$, and $42_3$ and $42_4$ based on PASS signals (shown in FIG. 3) asserted by each of elements $42_1$ and $42_2$ at the input of the digital token passing circuit 180A when such elements have completed their BIST testing. The PASS signals are levels rather than pulse signals. When the circuit 180A determines that such PASS signals have been received, the circuit 180A asserts a TOKEN signal (shown in FIGS. 3 and 6) to pass control to the next column of SBRIC_RS elements $42_3$ and $42_4$. Accordingly, the SBRIC_RS elements $42_1$ to $42_2$ need not be run on the same clock in order to synchronize the operation of passing control to the next column. In this way, each of the SBRIC RS elements $42_1$ and $42_2$ can run synchronously with the clocks which run their respective RSB elements $24_1$ to $24_5$, and $24_6$ to $24_8$, respectively. Our invention accordingly provides unambiguous communication between columns of SBRIC_RS elements $42_1$ and $42_2$, and $42_3$ and $42_4$ as well as synchronous communication between each of the SBRIC_RS elements $42_1$ and $42_4$ and their RSB elements $24_1$ to $24_{18}$.

Another aspect of the illustrative embodiment shown in FIGS. 2 and 2A is the skip function. Each of the SBRIC_RS elements $42_1$ to $42_4$ and the SBRIC_RL element 44 include a mechanism, for example, a programmable switch, whereby they can be skipped or rendered inactive for a given UBS 12 execution of BIST. The mechanism can be made available at any time during the life of the UBS 12 (other than during BIST execution). This skip function provides increased flexibility for the use of the UBS 12. For example, for a given execution of BIST, the Random Logic circuit 16 tested through the SBRIC_RL element 44 can be disabled in order to decrease the testing time for the remainder of the SBRIC elements 40 and $42_1$ to $42_4$. As another example, in an alternative embodiment, all SBRIC_RS elements $42_1$ to $42_4$ save one can be disabled in order to focus on testing a given sub-group of RSB elements within $24_1$ to $24_{18}$. In FIG. 2, there is shown a BISTSKIP_xy signal to the USB 12. The BISTSKIP_xy signal can comprise a plurality of bits, where each bit corresponds to an SBRIC_RS element $42_1$ to $42_4$ by its x and y components and identifies whether such element is to be skipped. The BISTSKIP_xy signal can be sourced by the Boundary Scan controller 18 and/or the System BIST controller 22 via configurable registers. In addition, in this embodiment, the SBRIC_RL element 44 can also be assigned x and y components in order for the skip function to be applied to such element 44. However, this feature need not be included in a given design of the UBS 12.

Figure 3:
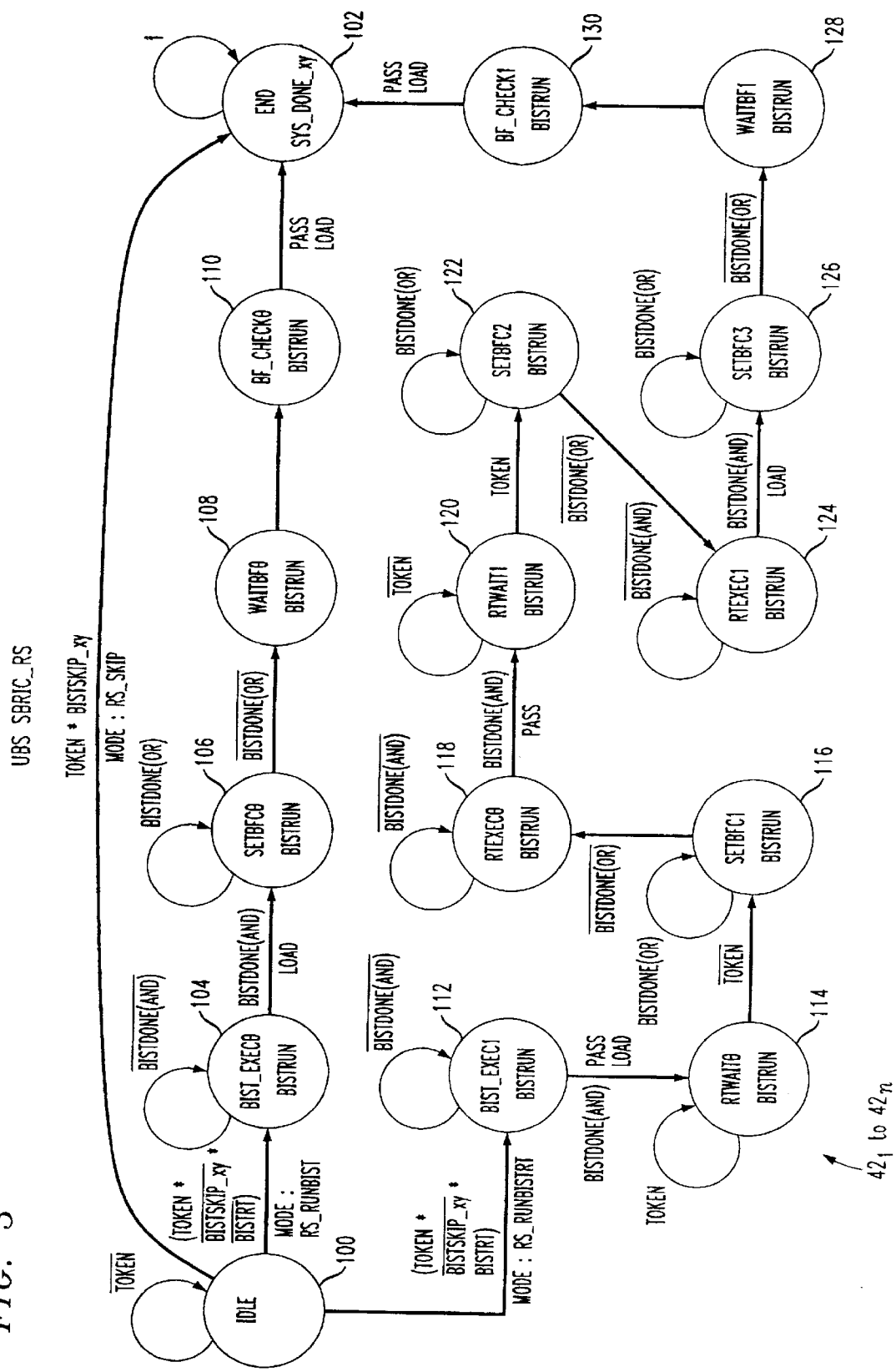
FIG. 3 is a state diagram of the SBRIC_RS element comprising part of the UBS of FIG. 1.

Referring to FIG. 3, there is illustrated the state diagram applicable to each of the SBRIC_RS elements $42_1$ to $42_n$. For ease of discussion, the SBRIC_RS element $42_1$ will be used as an exemplary element. However, the state diagram applies to each of the SBRIC_RS elements $42_1$ to $42_n$. In addition, the following conventions will be used as alternatives for the SBRIC_RS element $42_1$ and the elements it controls: the SBRIC RS element $42_1$ is alternatively referred to as the SBRIC_RS_A1; the RSBCt1 element $28_1$, which the SBRIC_RS_A1 controls, is alternatively referred to as the RSBCt1_A1; and, the RSB elements $28_1$ to $28_5$, which the SBRIC_RS_A1 controls through the RSBCt1_A1, are alternatively referred to as the RSBs_A1. These elements are shown in FIG. 2A and will be referenced, but not shown, in regard to FIGS. 3 to 6.

Referring again to FIG. 3, the SBRIC_RS_A1 comprises a finite state machine, which can be configured in three different ways based on three modes of operation (hereinafter referred to as "modes"): first, the SBRIC_RS_A1 is skipped (hereinafter referred to as the RS_SKIP mode); second, the SBRIC_RS_A1 is executed (i.e., the SBRIC_RS_A1 is programmed to be active) and retention testing (i.e., multiple passes) is not executed (hereinafter referred to as the RS_RUNBIST mode); and, third, both the SBRIC_RS_A1 and retention testing are executed (hereinafter referred to as the RS_RUNBISTRT mode).

During the execution of BIST testing for the SBRIC_RS_A1, a BISTRUN signal at a binary one value is applied by the SBRIC_RS_A1 to the RSBCt1_A1 during all states except for an IDLE state 100 and the END state 102. The BISTRUN signal serves to initiate processing by the RSBCt1_A1 when the SBRIC_RS_A1 is active and to disable such RSBCt1_A1 when the SBRIC_RS_A1 has completed processing or to abort any BIST in progress.

The SBRIC_RS_A1 need not be in the same mode during every BIST execution by the UBS 12. Also, in alternative embodiments, each of the three modes need not be available to the SBRIC_RS_A1 in the design of the UBS 12 and need not be programmable by the user (i.e., the availability of one or more modes can be an unalterable feature of the UBS 12 design). Accordingly, variations on the availability and programmability of the modes can apply to each SBRIC_RS element $42_1$ to $42_n$ individually, including applying different variations to individual elements $42_1$ to $42_n$ in the same column. For example, the SBRIC_RS element $42_3$ can be in a different mode than the SBRIC_RS element $42_4$, and either can be unavailable.

The following conventions apply to the FIG. 3 illustration: the three modes are provided for at the outset of operations for such modes by "MODE:RS_SKIP", "MODE:RS_RUNBIST" and "MODE:RS RUNBISTRT"; the states have reference numbers, e.g., the IDLE state 100; and, terms in between states are state transition conditions and operations. The state transition conditions include the TOKEN, BISTSKIP_xy, BISTRT, BISTDONE(AND) and BISTDONE(OR) signals, where a signal with an overline signifies a binary zero value for such signal and a signal without an overline signifies a binary one value for such signal. The operations include LOAD and PASS. Where multiple conditions are shown, they are separated by a "*" and enclosed in parenthesis. In addition, these conventions apply to each of FIGS. 3 to 5, except that the particular modes, states and terms vary for each of the Figures.

In the RS_SKIP mode, as shown in FIG. 3, there can be two states, comprising the IDLE state 100 and the END state 102. At the outset of operations, the SBRIC_RS_A1 remains in the IDLE state 100 for as long as the TOKEN signal is a binary zero value. When the TOKEN signal reaches a binary one value, the SBRIC_RS_A1 evaluates the value of a BISTSKIP_A1 signal (the bit of the BISTSKIP_xy signal which corresponds to the SBRIC_RS_A1 shown in FIG. 2). The BISTSKIP_A1 signal implements the skip function. If the BISTSKIP_A1 signal has a binary one value, then the SBRIC_RS_A1 enters the END state 102, at which time the activity of the SBRIC_RS_A1 ends. The SBRIC_RS_A1 remains in the END state 102, as illustrated by a constant return 1 signal (which also applies to each END state described herein). During the END state 102, no further activity is performed and the SYS_DONE_xy signal is asserted. At any time, the status of BIST testing can be read from the UBS 12 to determine, for example, whether the SBRIC_RS_A1 has completed its activity.

FIG. 3 also illustrates the state diagram corresponding to the RS_RUNBIST mode. In this mode, the SBRIC_RS_A1 is executed without retention testing, indicated by a binary zero value for the BISTRT signal. In addition, the SBRIC_RS_A1 includes six states, comprising the IDLE state 100, a BIST_EXEC0 state 104, a SETBFC0 state 106, a WAITBF0 state 108, a BF_CHECK0 state 110 and the END state 102.

At the outset of operations, the SBRIC_RS_A1 remains in the IDLE state 100 for as long as the TOKEN signal is a binary zero value. When the TOKEN signal reaches a binary one value, then the SBRIC_RS_A1 enters the BIST execution state 104. As shown in FIG. 3, the SBRIC_RS_A1 enters the BIST_EXECO state 104 when each of the following signals are received: the TOKEN signal having a binary one value, the BISTSKIP_xy signal having a binary zero value (which indicates that the execution of the SBRIC_RS_A1 is active, rather than skipped) and the RT signal having a binary zero value (which indicates that retention testing will not be executed).

During the BIST EXECO state 104, the SBRIC_RS_A1 applies a BISTRUN signal to the RSBCt1_A1 in order to initiate BIST testing of the RSBs_A1. In response to the BISTRUN signal, the RSBCt1 controls each RSB_A1 to execute a BIST testing routine according to its particular structure. The results of the BIST testing undertaken by each RSB_A1 are reflected in the status of a flag, referred to as a BIST flag (not shown), within the RSBCt1_A1. The BIST flag corresponding to each RSB_A1, which is generally one bit wide, is set to a binary zero value for a "pass" condition (i.e., a successful BIST test) while the flag is set to a binary one value for a "fail" condition (i.e., an unsuccessful BIST test). The BIST flag serves as the test signature for each RSB_A1. After the RSBs_A1 have completed their BIST testing, the BIST flags from the RSBCt1_A1 (which corresponds to each RSB_A1) are concatenated into a BISTF signal for transmission by the RSBCt1_A1 to the SBRIC_RS_A1. The BISTF signal has a bus width equivalent to the number of the RSBs_A1 controlled by the RSBCt1_A1.

In addition, once the BISTF signal is set, the RSBCt1_A1 asserts a BIST complete signal (hereinafter referred to as the BISTDONE signal) having a binary one value to the SBRIC_RS_A1, in order to indicate that the RSBs_A1 have completed their BIST routines. Where there are multiple RSBCt1s, e.g., as shown for SBRIC_RS_A2 in FIG. 2A, the BISTDONE signals from the RSBCt1s_A2 indicating that their BIST testing has been completed are logically ANDed to produce the BISTDONE(AND) signal having a binary one value. When leaving the BIST_EXEC0 state 104, the SBRIC_RS_A1 initiates loading of the BISTF signal from the RSBCt1_A1 into signature registers corresponding to each of the RSBs_A1 (shown as the LOAD operation). The SBRIC_RS_A1 then enters the SETBFC0 state 106.

During the SETBFC0 state 106, the SBRIC_RS_A1 sends a BIST flag check signal (hereinafter referred to as the BISTFC signal; not shown) to the RSBCt1_A1. Even though each of the RSBs_A1 has undergone successful BIST testing, one or more elements may be defective because its corresponding BIST flag is stuck at a binary zero (i.e., the BIST flag erroneously indicates a successful test). To avoid a "false positive" test result, the RSBCt1_A1 is supplied with the BISTFC signal at its completion of BIST testing. The BISTFC signal serves to toggle (i.e., change the state of) the BIST flag corresponding to each of the RSBs_A1. If the BIST flag toggles in response to the BISTFC signal, then the test result, reflected by the state of the BIST flag within the RSBCt1_A1, is accurate.

Although the SBRIC_RS_A1, the RSBCt1_A1 and the RSBs_A1 are each driven by the same clock signal CKA1, there may be design issues for a given UBS 12 which impact the otherwise synchronous communications between the devices. For example, the SBRIC_RS_A1 can be located at a physical distance from the CKA1 such that the timing as to the SBRIC_RS_A1 can be slightly off from the timing of the RSBCt1_A1. To reduce any potential timing issues, when the RSBCt1_A1 receives the BISTFC signal from the SBRIC_RS_A1, the RSBCt1_A1 returns a handshake signal by toggling the BISTDONE signal to a binary zero value and transmitting it to the SBRIC_RS_A1. Where there are multiple RSBCt1s, e.g., as shown for SBRIC_RS_A2, in FIG. 2A, the BISTDONE signals from the RSBCt1s_A2, indicating that their BIST testing has been completed, are logically ORed to produce the BISTDONE (OR) signal having a binary zero value.

The SBRIC_RS_A1 then enters the WAITBF0 state 108 from the BISTFC0 state 106 in order to provide a period of clock cycles for the RSBCt1_A1 to toggle the BIST flags for each of the RSBs_A1. Once the period of clock cycles is completed (which can be determined according to the particular embodiment of the UBS 12) the SBRIC_RS_A1 enters the BF_CHECK0 state 110.

When leaving the BF_CHECK0 state 110, the SBRIC_RS_A1 once again loads the BISTF signals from the RSBCt1_A1 into the corresponding signature registers in the SBRIC_RS_A1. Since the SBRIC_RS_A1 had previously toggled the BISTF signal to contain binary one values, the BISTF signal received by the SBRIC_RS_A1 should contain binary one values. At this time, the SBRIC_RS_A1 also asserts the PASS signal having the binary value of the TOKEN signal to the digital token passing circuit 180A (illustrated by the PASS operation). The SBRIC_RS_A1 then enters the END state 102, where it discontinues transmitting the BISTRUN signal to the elements it controls and asserts its SYS_DONE_xy signal.

Referring again to FIG. 3, in the RS_RUNBISTRT mode, both the SBRIC_RS_A1 and retention testing are executed. In this mode, the SBRIC_RS_A1 comprises twelve states, which comprise the IDLE state 100, a BIST_EXEC1 state 112, a RTWAIT0 state 114, a SETBFC1 state 116, a RTEXEC0 118, a RTWAIT1 state 120, a SETBFC2 state 122, a RTEXEC1 state 124, a SETBFC3 state 126, a WAITBF1 state 128, a BF_CHECK1 state 130 and the END state 102.

The outset of operations is equivalent to that for the prior modes except that when the TOKEN signal reaches a binary one value, the SBRIC_RS_A1 enters the BIST_EXEC1 state 112 when each of the following signals are asserted: the BISTSKIP_xy signal having a binary zero value (which indicates that the execution of the SBRIC_RS_A1 is active) and the BISTRT signal having a binary one value (which indicates that the execution of the retention testing is active).

The BIST_EXEC1 state 112 is equivalent to the BIST_EXEC0 state 104 for the RS_RUNBIST mode shown in FIG. 3 in its operation and signals used for such operation. During the BIST_EXEC1 state 112, the SBRIC_RS_A1 initiates BIST testing for each of the RSBs_A1 it controls (through the RSBCt1_A1). The SBRIC_RS_A1 remains in this state until BIST testing is completed, as shown by the high value BISTDONE signal from the RSBCt1_A1. Where there are multiple RSBCt1s, e.g., as shown for SBRIC_RS_A2 in FIG. 2A, the BISTDONE signals from the RSBCt1s_A2 indicating that their BIST testing has been completed are logically ANDed to produce the BISTDONE (AND) signal having a binary one value. Upon leaving this state 112, the SBRIC_RS_A1 also loads the BISTF signals from the RSBCt1_A1 into their corresponding signature registers. Also, upon leaving this state 112, the SBRIC_RS_A1 passes the PASS signal having a binary zero value to the digital token passing circuit 180A.

The SBRIC_RS_A1 is in the RTWAIT0 state 114 for so long as the TOKEN signal remains at a binary one value. Using the embodiment shown in FIG. 2A, when the other SBRIC_RS element $42_2$ in column A has also sent the PASS signal (e.g., it enters the state 114), the circuit 180A asserts the TOKEN signal to the SBRIC_RS elements $42_3$ to $42_4$ in column B to initiate processing. Each SBRIC_RS element $42_3$ to $42_4$ in turn executes their BIST according to their mode and passes their PASS signals to the circuit 180A. This continues until the TOKEN signal is passed through the SBRIC_RL element 44 to the SBRIC_RT element 40.

The processing of the SBRIC_RT element 40 allows for retention testing. During this state 114, for any SBRIC RS element $42_1$ to $42_4$ implementing retention testing, a waiting period is implemented according to a particular embodiment of our invention. When the waiting period is complete, the SBRIC_RT element 40 passes the TOKEN signal (now having a binary zero value) to the SBRIC_RS_A1.

Once the SBRIC_RS_A1 receives the TOKEN signal having a binary zero value, it continues processing according to the state diagram of FIG. 3 by entering the SETBFC1 state 116. The SETBFC1 state 116 is equivalent to the SETBFC0 state 106 for the RS_RUNBIST mode shown in its operation and signals used for such operation. During the SETBFC1 state 116, the SBRIC_RS_A1 sends a BISTFC signal to the RSBCt1_A1 to toggle the BISTF signal corresponding to each of the RSBs_A1 and waits for a return handshake BISTDONE signal having a binary zero value. Where there are multiple RSBCt1s, e.g., as shown for SBRIC_RS_A2 in FIG. 2A, the BISTDONE signals from the RSBCt1s_A2 indicating that their BIST testing has been completed are logically ORed to produce the BISTDONE (OR) signal having a binary zero value.

The BISTDONE signal having a binary zero value causes the SBRIC_RS_A1 to move from the SETBFC1 state 116 to the RTEXEC0 state 118. During the RTEXEC0 state 118, the RSBCt1_A1 continues the retention testing of each of the RSBs_A1 according to the particular structure of each element. For example, if the RSBs_A1 are RAM, each memory cell of the device may be analyzed to determine whether there has been any loss of data over time. Should there be an error detected in any of the RSBs_A1 during the RTEXEC0 state 118, the BISTF signal corresponding to such element will be toggled to a binary value indicating a fail state, e.g., a binary one value. When the RSBCt1_A1 has completed the data set up portion of retention testing, it transmits the BISTDONE signal to the SBRIC_RS_A1. Where there are multiple RSBCt1s, e.g., as shown for SBRIC_RS_A2 in FIG. 2A, the BISTDONE signals from the RSBCt1s_A2 indicating that their BIST testing has been completed are logically ANDed to produce the BISTDONE (AND) signal having a binary one value. In addition, the RSBCt1_A1 toggles the values in each memory cell of the RSBs_A1 which have been evaluated for retention testing to the opposite binary value. For example, where the initial values were binary zero, the RSBCt1_A1 toggles them to binary one values. In this way, retention testing can be performed for the opposite bit pattern in order to complete such testing.

When leaving this state 118, the SBRIC_RS_A1 asserts the PASS signal to the digital token passing circuit 180A. In this way, once again using the embodiment in FIG. 2A, during the waiting period used for retention testing, the SBRIC_RS elements $42_3$ to $42_4$ in the next column B can initiate processing, provided that all the SBRIC_RS elements $42_1$ to $42_2$ in column A have passed their PASS signals to the circuit 180A.

In order for the SBRIC_RS_A1 to move to the next state, the SETBFC2 state 122, the SBRIC_RS_A1 looks for the TOKEN signal having a binary one value. The TOKEN signal becomes a binary one value when all of the SBRICS, including the SBRIC_RL element 44, the SBRIC_RT element 40 and the SBRIC_RS elements $42_1$ to $42_4$, have completed a stage of their BIST testing according to their mode and corresponding state diagram.

For state 122, the SBRIC_RS_A1 operates in the same manner as the SETBFC1 state 116 in its operation and signals used for such operation. During the SETBFC2 state 122, the SBRIC_RS_A1 sends a BISTFC signal to the RSBCt1_A1 to toggle the BISTF signal corresponding to each of the RSBs_A1 and waits for the return handshake BISTDONE signal having a binary zero value. Where there are multiple RSBCt1s, e.g., as shown for SBRIC_RS_A2 in FIG. 2A, the BISTDONE signals from the RSBCt1s_A2 indicating that their BIST testing has been completed are logically ORed to produce the BISTDONE(OR) signal having a binary zero value.

The SBRIC_RS_A1 then moves to the RT_EXEC1 state 124. The state 124 is equivalent to the RT_EXEC0 state 118 in its operation and signals used for such operation. During the RTEXEC1 state 124, the RSBCt1_A1 continues the retention testing of each of the RSBs_A1. However, during this execution, the memory cell values tested are the complements of those tested in the RTEXEC0 state 118. In addition, should there be an error detected in any of the RSBs_A1 during the RTEXEC1 state 124, the BISTF signal corresponding to such element will be toggled to a binary value indicating a fail state, e.g., a binary one value. When the RSBCt1_A1 has completed retention testing, it transmits its BISTDONE signal and BISTF signals to the SBRIC_RS_A1. Where there are multiple RSBCt1s, e.g., as shown for SBRIC_RS_A2 in FIG. 2A, the BISTDONE signals from the RSBCt1s_A2 indicating that their BIST testing has been completed are logically ANDed to produce the BISTDONE(AND) signal having a binary one value. Upon receiving the BISTDONE signal, the SBRIC_RS_A1 leaves the state 124 and loads the BISTF signals from the RSBCt1_A1 into the signature registers corresponding to the RSBs_A1, as shown by the LOAD operation.

The SBRIC_RS_A1 then enters the SETBFC3 state 126. From this point to the end of the state diagram for the RS_RUNBISTRT mode, the processing is equivalent to the RS_RUNBIST mode in its operation and signals used for such operation. That is, the SETBFC3 state 126, the WAITBF1 state 128 and the BF_CHECK1 state 130 are equivalent to the SETBFC0 state 106, the WAITBF0 state 108 and the BF_CHECK0 state 110, respectively, for the RS_RUNBIST mode. When the SBRIC_RS_A1 leaves the BF_CHECK1 state 130 and enters the END state 102, it discontinues transmitting the BISTRUN signal to the RSBCt1_A1 it controls and asserts its SYS_DONE_xy signal.

Figure 4:
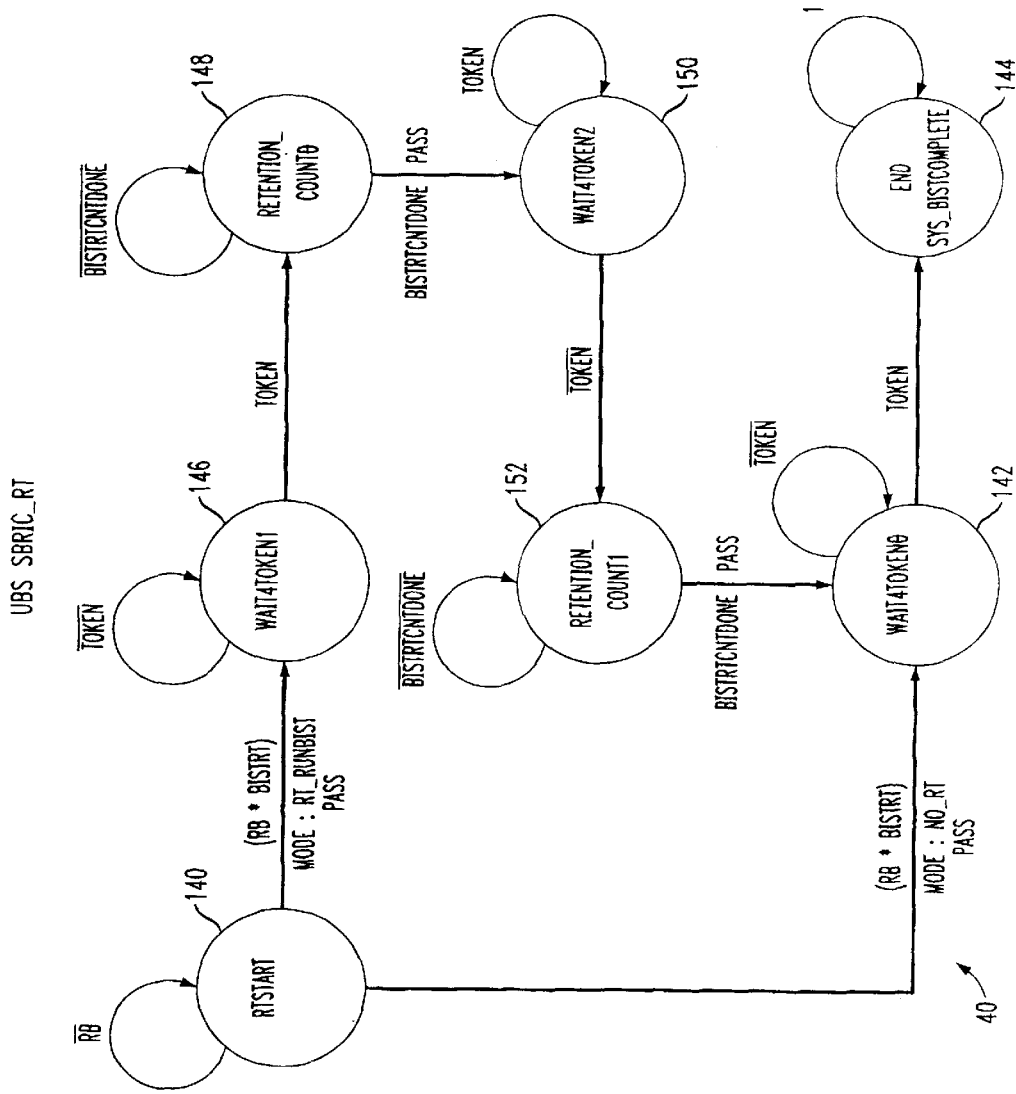
FIG. 4 is a state diagram of the SBRIC_RT element comprising part of the UBS of FIG. 1.
Figure 5:
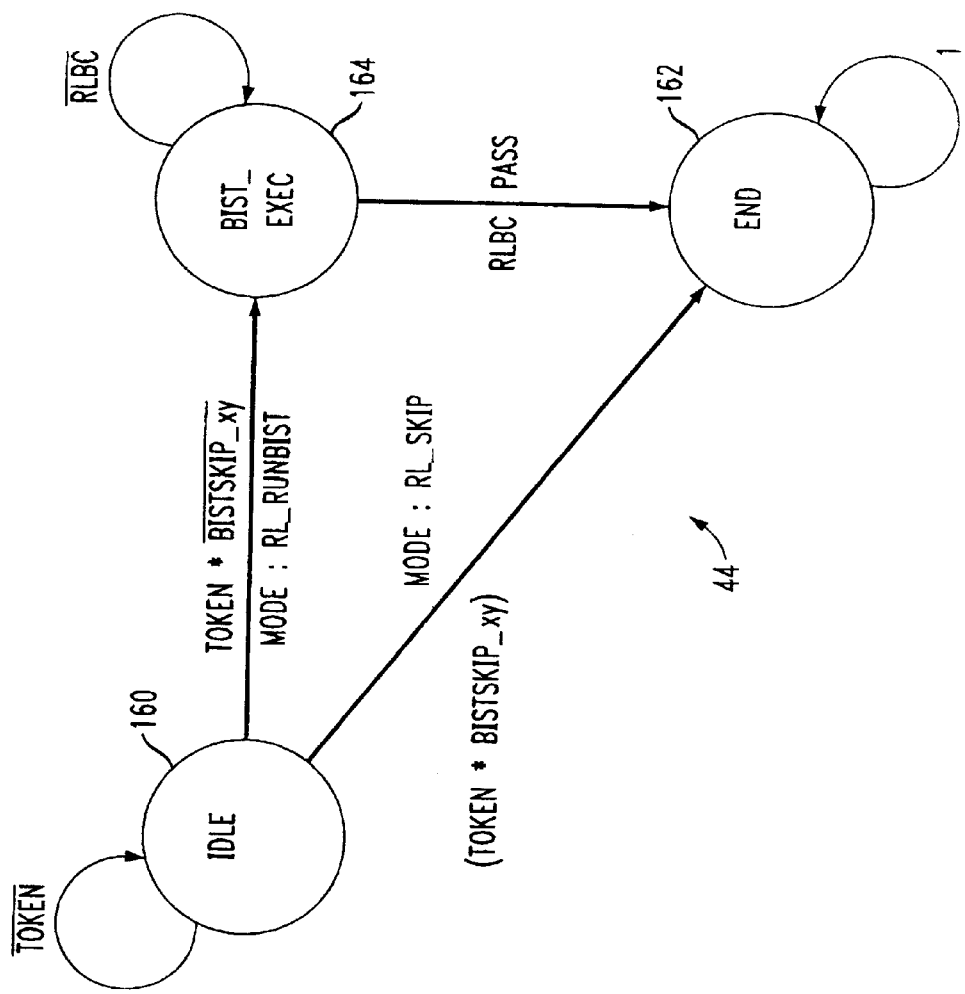
FIG. 5 is a state diagram of the SBRIC_RL element comprising part of the UBS of FIG. 1.
Figure 6:
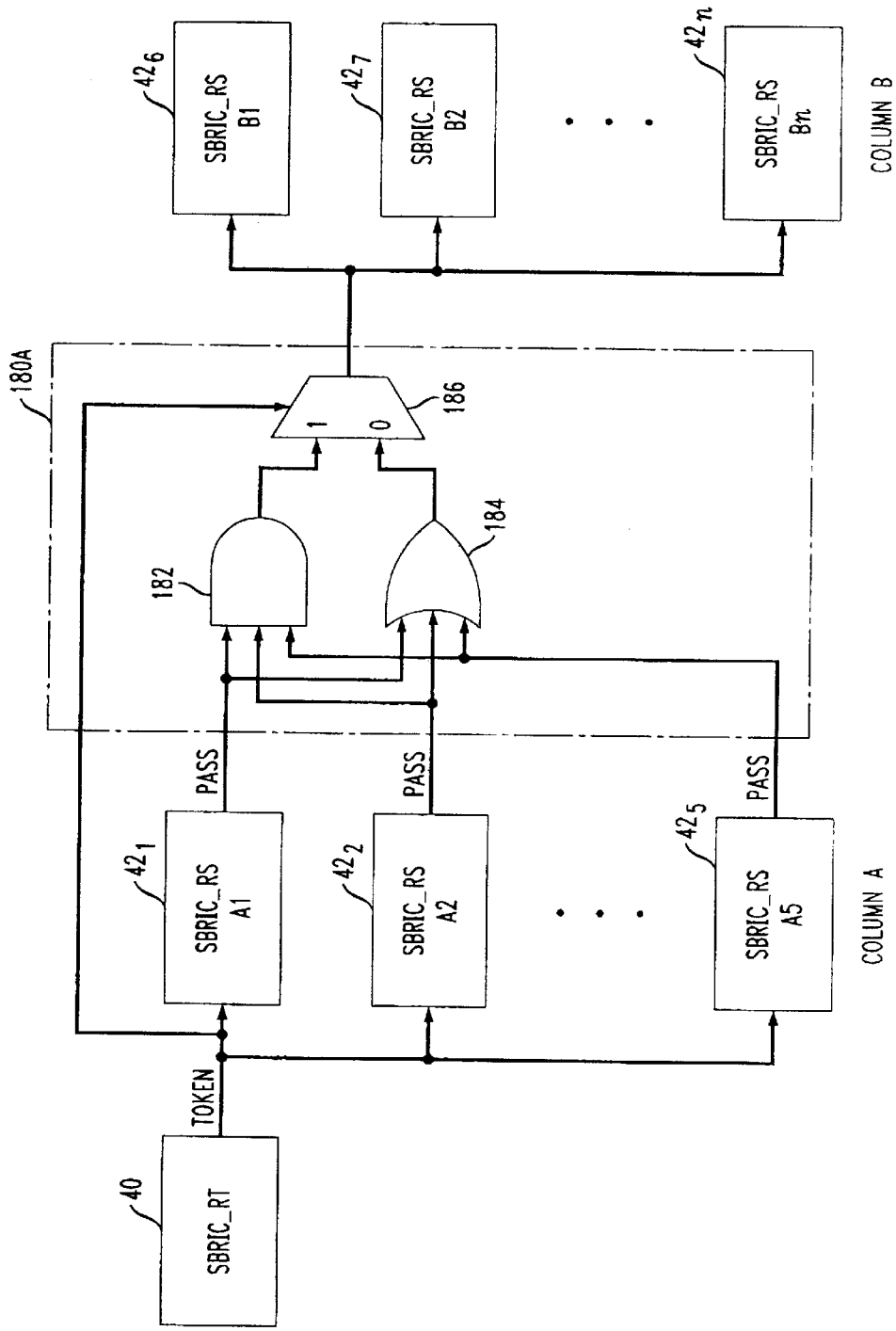
FIG. 6 is a block diagram of the digital token passing circuit comprising part of the UBS of FIG. 1.

For ease of description of the remaining FIGS. 4 to 6, the number and configuration shown in FIG. 2A of elements $42_1$ to $42_4$ and the elements they control, $28_1$ to $28_8$ and $24_1$ to $24_{18}$, are used as the exemplary embodiment. In addition, the elements $42_1$ to $42_n$, $28_1$ to $28_r$ and $24_1$ to $24_m$ are also used for a generic description of alternative embodiments.

Referring to FIG. 4, there is shown the state diagram for the SBRIC_RT element 40. The SBRIC_RT element 40 comprises a finite state machine, which can have two different configurations corresponding to two modes: first, retention testing is not performed (hereinafter referred to as the NO_RT mode); and, second, retention testing is performed (hereinafter referred to as the RT_RUNBIST mode). These two modes are selected via the BISTRT signal. The signals are RB, BISTRT, TOKEN and BISTRTCNTDONE; and, the operation is PASS.

In alternative embodiments according to our invention, both of the modes need not be available to the SBRIC_RT element 40 in the design of the UBS 12 and/or need not be programmable by the user of the UBS 12 (i.e., the availability of the states can be an unalterable feature of the UBS 12 design). Accordingly, variations in the availability and programmability of the modes are contemplated as within the scope of our invention.

In addition, the SBRIC_RT element 40 (FIG. 2) performs the function of scheduling BIST testing of the SBRIC elements $42_1$ to $42_n$, and 44 by initiating the processing of each element. The SBRIC_RT element 40 performs this function regardless of whether the SBRIC_RT element 40 is in the NO_RT or RT_RUNBIST modes. Such scheduling includes the SBRIC_RT element 40 (on command from either the Boundary Scan controller 18 on System BIST controller 22) initiating processing of the first column containing one or more SBRIC_RS elements $42_1$ to $42_n$, and, when processing of the first column is complete, initiating processing of each subsequent column in turn. For example, the SBRIC_RT element 40 passes the TOKEN signal having a binary one value in order to initiate processing of the first column A elements $42_1$ to $42_2$. As to the second column B of the SBRIC elements $42_3$ to $42_4$, the SBRIC_RT element 40 controls the digital token passing circuit 180A as to the binary value of the input PASS signals from each of the first column A SBRIC_RS elements $42_1$ to $42_2$ necessary for the TOKEN signal to be passed to the next column B SBRIC_RS elements $42_3$ to $42_4$. In addition, the SBRIC_RT element 40 also controls the circuit 180B in the same manner for passing the TOKEN signal from the last column B, containing the set of the SBRIC_RS elements $42_3$ to $42_4$, to the SBRIC_RL element 44. In an alternative embodiment, the first column A may contain all of the SBRIC_RS elements $42_1$ to $42_n$ such that the TOKEN signal is passed from the first column A directly to the SBRIC_RL element 44. In further alternative embodiments, the UBS 12 can contain additional columns of SBRIC_RS elements $42_1$ to $42_n$.

Referring again to FIG. 4, there is shown the state diagram for the SBRIC_RT element 40 in the NO_RT mode and the RT_RUNBIST mode. In the NO_RT mode, the SBRIC_RT element 40 includes three states, comprising a RTSTART state 140, a WAIT4TOKEN0 state 142 and an END state 144.

At the outset of operations, the SBRIC_RT element 40 remains in the RTSTART state 140 for as long as a RB signal (not shown) has a binary zero value. The RB signal initiates processing of the SBRIC_RT element 40 and can originate from assertions of either the SYS_DOBIST signal from the Boundary Scan controller 18 or both of the BS_DOBIST and BS_RUNTST signals from the System BIST controller 22. Upon receiving the RB signal having a binary one value, the SBRIC_RT element 40 initiates processing by analyzing the value of the BISTRT signal. The BISTRT signal can be sourced from the Boundary Scan controller 18 and/or the System BIST controller 22 via configurable registers. The BISTRT signal also provides the mode in which the SBRIC_RT element 40 will operate. Such a BISTRT signal can be set during the design of the particular UBS 12 or, in an alternative embodiment, the BISTRT signal can be programmable such that the value of the BISTRT signal can be changed during the life of the element 40 (other than during BIST execution). For the NO RT mode, the BISTRT signal is illustrated as having a binary zero value. Accordingly, the SBRIC_RT element 40 moves from the RTSTART state 140 to the WAIT4TOKEN0 state 142.

Before entering the WAIT4TOKEN0 state 142, the SBRIC_RT element 40 initiates the processing of the SBRIC elements $42_1$ to $42_4$ and 44 by asserting the PASS signal (which serves as the TOKEN signal because element 40 need not be synchronized with the other elements so a digital token passing circuit is unnecessary) having a binary one value to the first column A containing elements $42_1$ to $42_2$ (shown as the PASS operation). In this embodiment of the NO_RT mode, the TOKEN signal is passed to each of the SBRIC_RS elements $42_1$ to $42_4$ only once. This is because retention testing is not being executed so that no waiting period is necessary. However, the SBRIC_RT element 40 remains active in order to oversee BIST testing of the SBRIC elements $42_1$ to $42_4$, and 44.

The SBRIC_RT element 40 remains in the WAIT4TOKEN0 state 142 so long as the TOKEN signal has a binary zero value. Upon receiving the TOKEN signal having a binary one value, the SBRIC_RT element 40 moves to the END state 144 and asserts the SYS_BISTCOMPLETE signal. During the END state 144, the UBS 12 can produce, as an output to either the Boundary Scan controller 18 or a System BIST controller 22, the results of BIST testing.

In addition, referring to FIG. 4, there is shown the state diagram for the SBRIC_RT element 40 in the RT_RUNBIST mode. In this mode, the SBRIC_RT element 40 operates in combination with the SBRIC_RS elements $42_1$ to $42_1$ to execute retention testing. In the embodiment of FIG. 2A, two stages or passes around the ring of SBRIC elements 40, $42_1$ to $42_4$ and 44 are performed in order to test for retention testing faults for a binary value and its complement. Accordingly, during a first pass for retention testing, the wait period is applied to each of the RSB elements $24_1$ to $24_{18}$ (through the columns or sets of the SBRIC_RS elements $42_1$ to $42_4$) where the memory cells under test contain a first bit pattern, for example, each bit having a binary zero value. During a second pass, the wait period is applied to such elements $24_1$ to $24_{18}$ where the memory cells under test contain the complement of the first bit pattern, for example, each bit having a binary one value. The second bit pattern can result from reading the complementary bit pattern into the memory cells. However, our invention is not limited by the method of establishing the first and/or second bit patterns in the RSB elements $24_1$ to $24_{18}$; any method by which the memory cells contain a bit pattern is contemplated as within the scope of our invention.

The SBRIC_RT element 40 in the RT_RUNBIST mode includes seven states, comprising a RTSTART state 140, a WAIT4TOKEN1 state 146, a RETENTION_COUNT0 state 148, a WAIT4TOKEN2 state 150, a RETENTION_COUNT1 state 152, the WAIT4TOKEN0 state 142 and the END state 144. At the outset of operations, the SBRIC_RT element 40 remains in the RTSTART state 140 for as long as the RB signal has a binary zero value. Once the SBRIC_RT element 40 receives the RB signal having a binary one value, the SBRIC_RT element 40 initiates processing by evaluating the value of the BISTRT signal. Where the BISTRT signal is a binary one, the SBRIC_RT element 40 enters the WAIT4TOKEN1 state 146.

Before entering the WAIT4TOKEN1 state 146, the SBRIC_RT element 40 initiates the processing of the remaining SBRIC elements $42_1$ to $42_4$, and 44 by passing the PASS signal (which serves as the TOKEN signal) having a binary one value to the SBRIC_RS elements $42_1$ to $42_2$ in the first column A (shown as the PASS operation). The SBRIC_RT element 40 then waits for the each of the SBRIC_RS elements $42_1$ to $42_2$ to complete the processing to the point of applying the bit pattern for the first pass of retention testing. The SBRIC_RS elements $42_1$ to $42_2$ then enter a waiting period and output the TOKEN signal to initiate processing of the next column B containing elements $42_3$ to $42_4$ (or, in an alternative embodiment with a single column of SBRIC_RS elements $42_1$ to $42_n$, to the SBRIC_RL element 44) through the digital token passing circuit 180A.

For example, using the FIGS. 2A and 3 embodiment, during the BIST_EXEC1 state 112, each of the SBRIC_RS elements $42_1$ and $42_2$ initiate execution of BIST testing. Such testing results in each of the elements $24_1$ to $24_8$ producing a first bit pattern. Then, the elements $42_1$ and $42_2$ enter the RTWAIT0 state 114 in order to initiate a waiting period for the first pass of retention testing. Before entering state 114, the elements $42_1$ and $42_2$ assert their PASS signals to the input of the digital token passing circuit 180A. The circuit 180A then asserts the TOKEN signal to initiate processing of the column B SBRIC_RS elements $42_3$ to $42_4$ (on their respective RSB elements $24_9$ to $24_{18}$) to the point of entering the RTWAIT0 state 114 for the first pass of retention testing. The same processing applies to additional columns of SBRIC_RS elements $42_1$ to $42_n$. After the last column containing the SBRIC_RS element $42_n$ has completed such processing, the circuit 180B (as shown in FIG. 3) asserts its TOKEN signal to the SBRIC_RL element 44 for such element 44 to execute its BIST testing. Upon completing its processing, the SBRIC_RL element 44 then asserts the PASS signal (which serves as the TOKEN signal) having a binary one value to the SBRIC_RT element 40. This completes one pass through the ring of the SBRIC elements 40, $42_1$ to $42_4$, and 44.

Upon receiving the TOKEN signal having a binary one value from the SBRIC_RL element 44, the SBRIC_RT element 40 enters the RETENTION_COUNT0 state 148 (FIG. 4). During this state 148, the SBRIC_RT element 40 initiates or generates a period of clock cycles for the waiting period needed for retention testing. For example, a timeout counter or Automatic Test Equipment can generate the period of clock cycles. Methods of generating such clock cycle periods are well known and will not be described further herein. In addition, clock cycle periods can vary tremendously depending upon the types of RSB elements $24_1$ to $24_m$ tested and the design of the UBS 12. For example, in alternative embodiments, the clock rate can be 2 MHz or 100 MHz. Accordingly, our invention is not limited to a minimum or maximum clock cycle. The period is completed when the BISTRTCNTDONE signal changes from a binary zero to one value. The SBRIC_RT element 40 then moves from the RETENTION_COUNT0 state 148 to the WAIT4TOKEN2 state 150. The SBRIC_RT element 40 then asserts the PASS signal (which serves as the TOKEN signal) to column A SBRIC_RS elements $42_1$ to $42_2$ for them to continue processing the retention test in the RTEXEC0 state 118 (FIG. 3).

The SBRIC_RT element 40 processes the next two states, the WAIT4TOKEN2 state 150 and the RETENTION_COUNT1 state 152, in the same manner as the WAIT4TOKEN1 state 146 and the RETENTION_COUNT0 state 148 (FIG. 4). The difference between the sets of states is that the states 146 and 148 apply to the first pass of retention testing while the states 150 and 152 apply to the second pass of retention testing, where the second pass applies the complement of the bit pattern applied in the first pass.

When the TOKEN signal is again returned to the SBRIC_RT element 40, the RETENTION_COUNT1 state 152 and the WAIT4TOKEN0 state 142 are processed to generate a waiting period. The BISTRTCNTDONE signal having a binary value of one indicates that the counting period is complete. Then, the TOKEN signal is passed to the SBRIC_RS elements $42_1$ to $42_4$ to initiate the second pass of retention testing.

Moreover, the ring or multiple stage feature of our invention can also include additional passes through the SBRIC elements $40_1$, $42_1$ to $42_n$, and 44 in a given UBS 12. In the representative embodiment, there are three BIST stages. The first stage is the execution of the BIST algorithm, then there are two passes for retention testing of a bit value followed by its complement. In alternative embodiments, there can be stages in addition to or in place of retention testing according to the particular design of the UBS 12.

The SBRIC_RT element 40 remains in the WAIT4TOKEN0 state 142 so long as the TOKEN signal has a binary zero value. Upon receiving the TOKEN signal having a binary one value, the SBRIC_RT element 40 moves to the END state 144 and asserts the SYS_BISTCOMPLETE signal. During the END state 144, the UBS 12 can produce as its output the results of BIST testing and can direct this output to either the Boundary Scan controller 18 or a System BIST controller 22.

Referring to FIG. 5, there is shown the state diagram for the SBRIC_RL element 44. The SBRIC_RL element 44 comprises a finite state machine, which can operate in two modes: first, the SBRIC_RL element 44 is skipped (hereinafter referred to as the RL_SKIP mode); and, second, the SBRIC_RL element 44 is executed (hereinafter referred to as the RL_RUNBIST mode). In the FIG. 5 illustration, the modes are "MODE:RL_SKIP" and "MODE:RL_RUNBIST"; the signals are BISTSKIP_xy, RLBC and TOKEN; and the operation is the PASS operation.

FIG. 5 shows the states corresponding to the RL_SKIP mode and the RL_RUNBIST mode. In the RL_SKIP mode, the SBRIC_RL element 44 includes two states, comprising an IDLE state 160 and an END state 162. At the outset of operations, the SBRIC_RL element 44 remains in the IDLE state 160 for as long as a TOKEN signal has a binary zero value. When the TOKEN signal reaches a binary one value, then the SBRIC_RL element 44 evaluates the value of a BISTSKIP_xy signal where the SBRIC_RL element 44 is included in the x and y position designations along with the SBRIC_RS elements $42_1$ to $42_n$. Such BISTSKIP_xy signal can be determined during the design of the particular UBS 12 or, in alternative embodiments, the BISTSKIP_xy signal can be programmable such that its value can be changed before commencing BIST execution. If the value of the BISTSKIP_xy signal is a binary one value then the SBRIC_RL element 44 enters the END state 162, at which time the BIST testing for the SBRIC_RL element 44 is complete. The SBRIC RL element 44 remains in the END state 162. Since no SBRIC_RL element 44 was executed, there are no Random Logic circuit 16 results to be read.

FIG. 5 also illustrates the state diagram corresponding to the RL_RUNBIST mode. In this mode, the SBRIC_RL element 44 is executed. In addition, the SBRIC_RL element 44 includes three states, comprising an IDLE state 160, a BIST_EXEC state 164 and the END state 162. At the outset of operations, the SBRIC_RL element 44 remains in the IDLE state 160 for as long as the TOKEN signal is a binary zero value. The SBRIC_RL element 44 enters the BIST_EXEC state 164 when each of the following signals are received: the TOKEN signal having a binary one value and the BISTSKIP_xy signal having a binary zero value.

During the BIST_EXEC state 164, the SBRIC_RL element 44 executes BIST testing for the Random Logic circuit 16 by applying the BISTRUN signal (not shown) to the RLBCt1 element 20. In response to the BISTRUN signal, the RLBCt1 element 20 can execute BIST testing for each device of the Random Logic circuit 16 according to its particular structure. Once the BIST testing is complete, the RLB controller 20 generates a RLBC signal (not shown) having a binary one value. BIST testing of the Random Logic circuit 16 is well known, and, accordingly, will not be described further herein.

The SBRIC_RL element 44 remains in the BIST_EXEC state 164 for so long as the RLBC signal remains at a binary zero value. Upon receiving the RLBC signal having a binary one value, the SBRIC_RL element 44 enters the END state 162. Before entering the state 162, the SBRIC_RL element 44 asserts the PASS signal (which serves as the TOKEN signal because the element 44 need not be synchronized with other elements) to the SBRIC_RT element 40. During that state 162, the results of BIST testing for the Random Logic circuit 16 are available in the RLSIGREG element 21.

Referring to FIG. 6, there is shown the digital token passing circuit 180A which enables the SBRIC_RT element 40 to control passing the TOKEN signal between the columns of SBRIC elements $42_1$ to $42_n$, and 44 in order to ensure that each of the elements $42_1$ to $42_5$ in the first column complete their stage of BIST before processing is initiated in the column B SBRIC_RS elements $42_6$ to $42_n$. In this way, while the processing between each of the SBRIC_RS elements $42_1$ to $42_n$ in the same column can be asynchronous, the circuit 180A ensures that the processing for each SBRIC_RS element $42_1$ to $42_n$ in a column is complete before initiating processing for such elements in the next column.

The circuit 180A comprises an AND gate 182, an OR gate 184, and a multiplexer 186 (hereinafter referred to as the MUX 186) and is shown in FIG. 6 between the column A SBRIC_RS elements $42_1$ and $42_1$ and the column B SBRIC_RS elements $42_6$ and $42_n$. The circuit 180B is also placed between the column B of SBRIC_RS elements $42_6$ and $42_n$ and the SBRIC_RL element 44. Since the digital token passing circuit synchronizes the initiation of processing for multiple SBRIC elements $42_1$ to $42_n$ in a column, the circuit is not needed between the SBRIC_RL and SBRIC_RT elements 40 and 44, nor between the SBRIC_RT element 40 and column A SBRIC_RS elements $42_1$ to $42_5$. This is because the SBRIC_RL and SBRIC_RT elements 40 and 44 are single elements, which need not be synchronized with other elements. In addition, the MUX 186 can include a selection signal from the SBRIC_RT element 40 for the purpose of determining which input value the MUX 186 can accept for its output signal.

The circuit 180A operation is based on the use of the TOKEN signal to initiate or continue BIST processing. The TOKEN signal is used by the UBS 12 as follows: the column A SBRIC_RS elements $42_1$ to $42_5$ pass their PASS signals to the circuit 180A and the SBRIC_RT element 40 selects which binary value will be selected for the TOKEN signal as output from the MUX 186 to the next column B of SBRIC_RS elements $42_6$ to $42_n$. For the circuit 180A between columns A and B, the PASS signal from each element $42_1$ to $42_5$ is sent to the input of both the AND gate 182 and the OR gate 184. The outputs of the AND gate 182 and the OR gate 184, in turn, are the inputs to the MUX 186.

Accordingly, by the SBRIC_RT element 40 selecting which logic value the MUX 186 produces as the TOKEN signal at its output, the SBRIC_RT element 40 determines which of the output signals from either the AND or OR gates 182 and 184, respectively, is selected. In this way, the UBS 12 can be designed to synchronize the initiation or continuation of BIST processing for each column of SBRIC_RS elements $42_1$ to $42_n$ (which may be run on asynchronous clocks) because the signal at the output of circuit 180A, the TOKEN signal, is independent of any clock cycle.

For example, where the processing of the column B SBRIC_RS elements $42_6$ to $42_1$ can be initiated or continued by the TOKEN signal having a binary one value, the SBRIC_RT element 40 sends a selection signal to the MUX 186 for the logic value of 1 (shown in FIG. 6). In addition, when the column A SBRIC_RS elements $42_1$ to $42_5$ move from the BIST_EXEC1 state 112 to the RTWAIT0 state 114, each element asserts its PASS signal having a binary one value to the circuit 180A. The PASS signals are received as inputs to both the AND and OR gates 182 and 184. In turn, the outputs of the AND and OR gates 182 and 184 appear as inputs at the MUX 186. The output of the MUX 186 is determined by its inputs and the selection signal from the SBRIC_RT element 40. The MUX 186 therefore waits for the output of the AND gate 182 to go high in order to pass the TOKEN signal having a binary one value to the column B SBRIC_RS elements $42_6$ to $42_n$.

In alternative embodiments according to this invention, the selection signal to the MUX 186 need not be from the SBRIC_RT element 40. Rather, any device which can perform the selection function as needed for the particular design of the UBS 12 is contemplated as within this invention. For example, in one alternative embodiment, the UBS 12 can be designed without retention testing, in which case an alternative device can perform the function of monitoring the value of the TOKEN signal necessary to initiate testing of the next SBRIC elements $42_1$ to $42_1$ and 44 and to receive the TOKEN signal. In another alternative embodiment, where the UBS 12 is designed with retention testing, the device which performs the selection function can be different from the SBRIC_RT element 40.

Referring once again to FIGS. 1 to 2A, upon completion by each of the SBRIC elements 40, $42_1$ to $42_4$ and 44 elements of their BIST testing such that each element has entered its END state 102, 144 and 162, respectively, the results of the Regular Structure circuit 14 BIST testing are available as an output from the SBRIC_RS elements $42_1$ to $42_4$ and the results of the Random Logic circuit 16 testing are available as an output from the RLSIGREG element 21. In addition, at any time during processing of the UBS 12, the status of BIST testing can be read as an output from the UBS 12 to determine, for example, whether a particular or all of the SBRIC_RS elements $42_1$ to $42_4$ have completed BIST testing.

Such results from each SBRIC element $42_1$ to $42_n$ are in the form of a compacted signature output comprising a test signature bit flag from each of their respective RSB elements $24_1$ to $24_m$. For each RSB element $24_1$ to $24_m$, where BIST testing is successful, the test signature bit flag can be zero. Where BIST testing fails, the test signature bit flag can be one. Accordingly, the fault free collection of the BIST signature bit flags can be a string of all zeros. The results from each of the SBRIC_RS elements $42_1$ to $42_4$ also include a string of bits indicating the stages or passes of BIST testing which have been completed. These two results are concatenated by each SBRIC_RS element $42_1$ to $42_n$ into a continuous string, which provides the status of the processing for each element $42_1$ to $42_n$, and the test signature for its respective RSB elements $24_1$ to $24_m$.

If the System BIST controller 22 is to be used for reading the output, the controller can read the results in parallel from the SBRIC_RS elements $42_1$ to $42_n$ via the SYS_RSSIG signal. If the Boundary Scan controller 18 is to be used for reading the output, the circuit 18 can control the RSSIGREG element 32 to read the results by using the BS_CPTDR signal (which has a binary value of one for one clock cycle) and shift out the results via the BS_SHDR signal.

Having thus described the present invention, it is to be understood that the above-described method and apparatus are embodiments illustrative of the principles of the present invention and that other methods and apparatus may be devised by those skilled in the art, without departing from the spirit and scope of the invention. In particular, while the embodiment described herein includes each of the SBRIC elements 40, 42₁ to 42ₙ, and 44, either of the SBRIC_RT element 40 (provided the functionality of such element 40 is provided for in another device) or SBRIC_RS element 44 can be excluded in the design of the UBS 12. In addition, while particular binary values were illustrated for particular signals, this invention is not limited to such values; rather, signals having the opposite binary values or pulse signals which function in the same manner as the binary value signals described herein are contemplated as within the scope of our invention. The invention is not to be considered limited by the specific examples illustrated herein, but by the appended claims.

We claim:

1. Apparatus for scheduling the self-testing of a plurality of electronic devices, each of said plurality of electronic devices having self-test circuitry, comprising:

said self-test circuitry comprising at least one test grouped for execution in a plurality of stages;

a plurality of resource controllers, each of said resource controllers controlling said self-test circuitry of at least one of said plurality of electronic devices; and said resource controllers processing in parallel to cause execution of said self-test circuitry in said electronic devices in said plurality of stages, each of said resource controllers being notified when said at least one of said electronic devices controlled by said controller has completed execution of each one of said plurality of stages.

2. Apparatus in accordance with claim 1 for scheduling self-testing of a plurality of electronic devices, each of said electronic devices having self-test circuitry, wherein said apparatus comprising means for initiating said resource controller to cause the execution of said self-test circuitry by each of said electronic devices in parallel.

3. Apparatus in accordance with claim 1 further comprising:

a digital logic circuit performing a sequence of steps, said circuit being in communication with said resource controller;

upon said resource controller being notified that said electronic device has completed execution of a first of said plurality of stages, said resource controller initiates processing by said digital logic circuit of a waiting period; and wherein, upon completion of said waiting period, said digital logic circuit initiates processing by said resource controller to control said electronic device to cause execution of said next one of said plurality of stages.

4. Apparatus in accordance with claim 3 wherein said digital logic circuit comprises a resource controller.

5. Apparatus in accordance with claim 4 wherein said resource controller comprises a Scheduled BIST Resource Interface controller.

6. Apparatus in accordance with claim 3 wherein said digital logic circuit further comprises a counter.

7. Apparatus in accordance with claim 1 wherein said plurality of stages for execution of said at least one test comprises three stages, wherein:

said first of said plurality of stages comprises a Built-In Self-Test;

said second of said plurality of stages comprises a retention test; and said third of said plurality of stages comprises a second retention test.

8. Apparatus in accordance with claim 1 wherein said resource controller is a Scheduled BIST Resource Interface controller.

9. Apparatus in accordance with claim 1 wherein said resource controller communicates with said electronic device through an electronic device controller.

10. Apparatus in accordance with claim 1 wherein said resource controller and said electronic device are synchronously run on the same clock domain.

11. Apparatus for scheduling the self-testing of a plurality of electronic devices, each of said electronic devices having self-test circuitry, comprising:

said self-test circuitry comprising at least one test grouped for execution in a plurality of stages;

a plurality of resource controller sets, at least one of said resource controller sets including a plurality of resource controllers and each of the remaining resource controller sets comprising at least one resource controller, wherein each of said plurality of resource controllers is in communication with at least one said electronic device to control said self-test circuitry; and said resource controllers processing in parallel to cause execution of said self-test circuitry in said electronic devices in said plurality of stages, each of said resource controllers being notified when said at least one of said electronic devices controlled by said controller has completed execution of each one of said plurality of stages.

12. Apparatus in accordance with claim 11 for initiating processing by each of said resource controller sets in sequence, further comprising:

a first digital logic circuit initiating processing by said resource controllers of a first of said resource controller sets to control said electronic devices of said first set to cause execution of one of said plurality of stages of said self-test circuitry; and after completion by each of said electronic devices of said first set of said one stage, a second digital logic circuit initiating processing by said resource controllers of a second of said resource controller sets to control said electronic devices of said second set to cause execution of said one stage of said self-test circuitry.

13. Apparatus in accordance with claim 12 wherein said first digital logic circuit is a resource controller.

14. Apparatus in accordance with claim 13 wherein said resource controller comprises a Scheduled BIST Resource Interface controller.

15. Apparatus in accordance with claim 13 wherein said second digital logic circuit comprises a multiplexer controlled by said first digital logic circuit.

16. Apparatus in accordance with claim 11 further comprising:

a digital logic circuit performing a sequence of steps, said circuit being in communication with a first of said resource controller sets;

upon each of said resource controller sets being notified that said electronic devices controlled by said resource controller have completed execution of one of said plurality of stages, means for initiating processing by said digital logic circuit of a waiting period; and wherein, upon completion of said waiting period, said digital logic circuit initiates processing by said resource controllers in said first resource controller set to cause execution of a next one of said plurality of stages of said self-test circuitry of said electronic devices controlled by said first set.

17. Apparatus in accordance with claim 16 wherein said digital logic circuit comprises a resource controller.

18. Apparatus in accordance with claim 17 wherein said resource controller comprises a Scheduled BIST Resource Interface controller.

19. Apparatus in accordance with claim 16 wherein said digital logic circuit further comprises a counter.

20. Apparatus in accordance with claim 11 wherein said plurality of stages for execution of said at least one test comprises three stages, wherein:

said first of said plurality of stages comprises a Built-In Self-Test;

said second of said plurality of stages comprises a retention test; and said third of said plurality of stages comprises a second retention test.

21. Apparatus in accordance with claim 11 wherein said resource controller is a Scheduled BIST Resource Interface controller.

22. Apparatus in accordance with claim 11 wherein at least one of said plurality of resource controllers communicates with at least one electronic device controlled by said resource controller through an electronic device controller.

23. Apparatus in accordance with claim 11 wherein at least one of said plurality of resource controllers and said at least one electronic device controlled by said resource controller are synchronously run on the same clock domain.

24. Apparatus in accordance with claim 11 wherein at least two of said plurality of resource controllers controlled by one of said plurality of resource controller sets are asynchronously run on different clock domains.

25. Method for scheduling the self-testing of a plurality of electronic devices, each of said electronic devices having self-test circuitry being controlled by a separate resource controller, said self-test circuitry comprising at least one test grouped for execution in a plurality of stages, comprising the steps of:

initiating processing of each of said separate resource controllers in parallel to cause execution of said self-test circuitry in each of said electronic devices in said plurality of stages; and notifying each of said resource controllers when said electronic device controlled by said controller has completed execution of each of said plurality of stages.

26. Method in accordance with claim 25 for scheduling the self-testing of a plurality of electronic devices, said method further comprising initiating said resource controller to cause execution of said self-test circuitry by each of said plurality of electronic devices in parallel.

27. Method in accordance with claim 25 using a digital logic circuit performing a sequence of steps and in communication with said resource controller, further comprising the steps of:

(a) initiating the processing of a waiting period by said digital logic circuit after said resource controller is notified that said electronic device has completed execution of one of said plurality of stages of said self-test circuitry;

(b) upon completion by said digital logic circuit of said waiting period, initiating the processing of said resource controller to cause said electronic device to execute a second of said plurality of stages of said self-test circuitry; and (c) repeating said (a) and (b) steps for a third of said plurality of stages.

28. Method for scheduling self-testing of a plurality of electronic devices wherein said plurality of electronic devices are controlled by a plurality of resource controller sets, at least one of said resource controller sets comprising a plurality of resource controllers and each of the remaining resource controller sets comprising at least one resource controller, each of said resource controllers controlling at least one of said electronic devices, and said electronic devices having self-test circuitry comprising at least one test grouped for execution in a plurality of stages, comprising the steps of:

(a) initiating processing of each of said one or more resource controllers in one resource controller set in parallel to cause said self-test circuitry of said electronic devices controlled by said resource controller set to execute one of said plurality of stages and notifying said one resource controller set when each of said electronic devices controlled by said one set have completed said one stage;

(b) repeating said (a) step for each of said plurality of resource controller sets;

(c) thereafter initiating processing of each of said one or more resource controllers in one resource controller set in parallel to cause said self-test circuitry of said electronic devices controlled by said resource controller set to execute a next one of said plurality of stages and notifying said one resource controller set when each of said electronic devices controlled by said one set have completed said next one stage;

(d) repeating said (c) step for each of said plurality of resource controller sets;

(e) repeating said (b) to (c) steps for each next one of said plurality of stages.

\* \* \* \* \*